US011848685B2

(12) United States Patent
Sandberg et al.

(10) Patent No.: US 11,848,685 B2
(45) Date of Patent: *Dec. 19, 2023

(54) SHIFT VALUES FOR QUASI-CYCLIC LDPC CODES

(71) Applicant: Telefonaktiebolaget LM Ericsson (PUBL), Stockholm (SE)

(72) Inventors: Sara Sandberg, Luleå (SE); Mattias Andersson, Sundbyberg (SE); Yufei Blankenship, Kildeer, IL (US)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 0 days.

This patent is subject to a terminal disclaimer.

(21) Appl. No.: 18/059,202

(22) Filed: Nov. 28, 2022

(65) Prior Publication Data

US 2023/0087194 A1     Mar. 23, 2023

Related U.S. Application Data

(63) Continuation of application No. 16/834,624, filed on Mar. 30, 2020, now Pat. No. 11,515,893, which is a
(Continued)

(51) Int. Cl.
*H03M 13/00* (2006.01)
*H03M 13/11* (2006.01)
(Continued)

(52) U.S. Cl.
CPC ..... *H03M 13/1168* (2013.01); *H03M 13/036* (2013.01); *H03M 13/116* (2013.01);
(Continued)

(58) Field of Classification Search
CPC ... H04L 1/0047; H04L 1/0057; H04L 1/0042; H03M 13/1168; H03M 13/15
See application file for complete search history.

(56) References Cited

U.S. PATENT DOCUMENTS 8,103,931 B2   1/2012   Wang et al.
8,341,492 B2   12/2012  Shen et al.
(Continued)

FOREIGN PATENT DOCUMENTS

CN    102412845 A    4/2012
KR    20150011085 A  1/2015
(Continued)

OTHER PUBLICATIONS

Moroccan Patent Office Official Action dated Jul. 24, 2020 in Application No. 47656.
(Continued)

*Primary Examiner* — Samir W Rizk
(74) *Attorney, Agent, or Firm* — BAKER BOTTS L.L.P.

(57) ABSTRACT

According to some embodiments, a method for use in a wireless transmitter of a wireless communication network comprises encoding information bits using a purity check matrix (PCM) and transmitting the encoded information bits to a wireless receiver. The parity check matrix (PCM) is optimized according to two or more approximate cycle extrinsic message degree (ACE) constraints. In some embodiments, a first portion of the PCM is optimized according to a first ACE constraint and a second portion of the PCM is optimized according to a second ACE constraint.

12 Claims, 5 Drawing Sheets

Related U.S. Application Data continuation of application No. 16/369,274, filed on Mar. 29, 2019, now Pat. No. 10,644,724, which is a continuation of application No. PCT/EP2018/067098, filed on Jun. 26, 2018.

(60) Provisional application No. 62/525,453, filed on Jun. 27, 2017.

(51) Int. Cl.
 H03M 13/15 (2006.01)
 H04L 1/00 (2006.01)
 H03M 13/03 (2006.01)

(52) U.S. Cl.
 CPC ............ H03M 13/15 (2013.01); H04L 1/00 (2013.01); H04L 1/0041 (2013.01); H04L 1/0042 (2013.01); H04L 1/0045 (2013.01); H04L 1/0047 (2013.01); H04L 1/0057 (2013.01)

(56) References Cited

U.S. PATENT DOCUMENTS

| | | | | |
|---|---|---|---|---|
| 10,644,724 | B2* | 5/2020 | Sandberg | .............. H04L 1/0041 |
| 11,515,893 | B2* | 11/2022 | Sandberg | .............. H04L 1/0042 |
| 2006/0129904 | A1 | 6/2006 | Blankenship et al. | |
| 2009/0106625 | A1 | 4/2009 | Jun et al. | |
| 2010/0153819 | A1 | 6/2010 | Ueng et al. | |
| 2010/0257425 | A1 | 10/2010 | Yue et al. | |
| 2016/0211941 | A1 | 7/2016 | Shen et al. | |

FOREIGN PATENT DOCUMENTS

| | | |
|---|---|---|
| RU | 2348103 C2 | 2/2009 |
| RU | 2574828 C2 | 8/2011 |
| RU | 2450443 C1 | 5/2012 |
| WO | WO2010035501 | 4/2010 |
| WO | 2013047258 A1 | 4/2013 |

OTHER PUBLICATIONS

Russian Patent Office, Decision on Grant, Application No. 2019144062/07 (085260), English Translation, dated Jun. 26, 2020.

Russian Patent Office, Decision on Grant, Application No. 2019144062/07 (085260), see above for translation, dated Jun. 26, 2020.

Russian Patent Office, Search Report, Application No. 2019144062/07 (085260).

Ace Spectrum of LDPC Codes and Generalized Ace Design by Dejan Vukobratovic et al.; IEEE Communications Society—2007.

3GPP TSG-RAN WG1 Meeting #89; Hangzhou, CN; Source: Mediatek Inc.; Title: On design and performance of NR eMBB LDPC Code (R1-1709856)—May 15-19, 2017.

PCT Notification of Transmittal of the International Search Report and the Written Opinion of the International Searching Authority, or the Declaration for International application No. PCT/EP2018/067098—dated Oct. 2, 2018.

Selective Avoidance of Cycles in Irregular LDPC Code Construction by Tao Tian et al.; IEEE Transaction on Communications, vol. 52, No. 8—Aug. 2004.

3GPP TS 38.212 v0.0.1; Technical Specification; 3rd Generation Partnership Project; Technical Specification Group Radio Access Network; NR; Multiplexing and Channel Coding (Release 15)—Jul. 2017.

European Patent Office, Communication regarding Extended European Search Report, Ref. No. 34101EP1/ab; App. No. 19211182.1-1210; dated Mar. 9, 2020, 12 pages.

3GPP TSG-RAN WG1 Meeting NR#2, Qingdao, CN, Jun. 27-30, 2017; Title: On NR LDPC design and performance; R1-1710829; 6 pages.

China Patent Office, Official Action and Search Report in CN Application No. 201880044491.6 dated Mar. 30, 2023 (no translation).

* cited by examiner

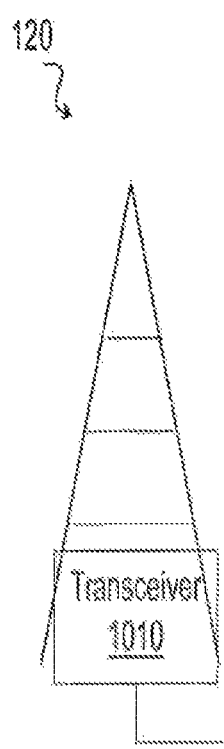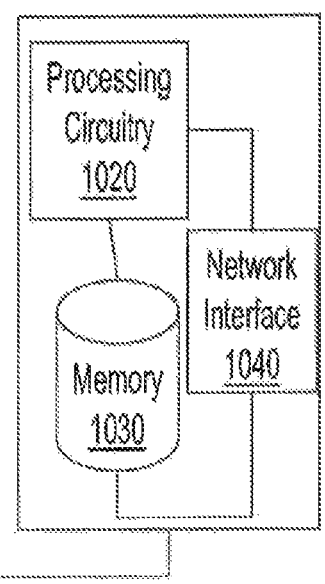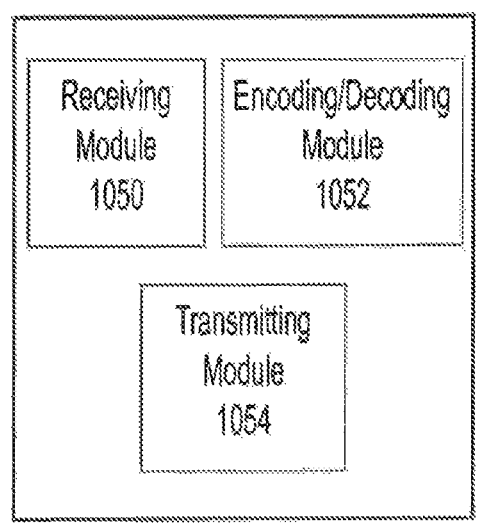
Fig. 5A                              Fig. 5B

SHIFT VALUES FOR QUASI-CYCLIC LDPC CODES

PRIORITY

This nonprovisional application is a continuation, under 35 U.S.C. § 120, of U.S. patent application Ser. No. 16/834,624 filed on Mar. 30, 2020, which is a continuation, under 35 U.S.C. § 120, of U.S. patent application Ser. No. 16/369,274 filed on Mar. 29, 2019, which is a U.S. National Stage Filing under 35 U.S.C. § 371 of International Patent Application Serial No. PCT/EP2018/067098 filed Jun. 26, 2018 and entitled "Shift Values for Quasi-Cyclic LDPC Codes" which claims priority to U.S. Provisional Patent Application No. 62/525,453 filed Jun. 27, 2017 all of which are hereby incorporated by reference in their entirety.

TECHNICAL FIELD

Particular embodiments are directed to wireless communications and, more particularly, to low-density parity check (LDPC) shift coefficient designs for New Radio (NR).

INTRODUCTION

Rate-compatible low-density parity check (LDPC) codes are important for mobile communications because they facilitate hybrid automatic repeat request (HARQ) retransmissions with incremental redundancy. Particular codes are also quasi-cyclic, which ensures simple encoding and decoding. Quasi-cyclic parity-check matrices are partitioned into square sub-blocks (sub-matrices) of size Z×Z. These submatrices are either cyclic-permutations of the identity matrix or null submatrices. The cyclic-permutation matrix Pk is obtained from the Z×Z identity matrix by cyclically shifting the columns to the right by k elements. The matrix P0 is the Z×Z identity matrix.

The structure of a quasi-cyclic LDPC code may be described through a base matrix. A base matrix has one elect for each Z×Z subblock in the corresponding parity-check matrix. An element in the base matrix may have value "0", which corresponds to a zero sub-block, or "1", which may correspond to any shifted Z×Z identity matrix. In general, the base matrix may have elements with values larger than 1, but such base matrices are not considered here.

Given a specific base matrix, the cyclic shifts (also called the shift coefficients), as well as Z, are defined to specify a parity-check matrix (PCM). The process of selecting the shift coefficients and specifying the parity-check matrix for a given base matrix is called lifting. The shift coefficients are typically specified through a matrix of the same size as the base matrix where each entry $P_{i,j}$ corresponds to a Z×Z submatrix in the final PCM. Entries with $P_{i,j}=-1$ in the matrix denote null (zero) submatrices, while entries with $P_{i,j}=k$ denote sub-matrices equal to Pk. Such a matrix, that together with Z specifies an LDPC code, may be referred to as a shift coefficient design. A specific parity-check matrix is obtained by selecting a shift size Z with a corresponding shift coefficient design and replacing each entry with the corresponding Z×Z matrix.

One method for construction of the parity-check matrix is the progressive edge growth (PEG) algorithm. PEG construction builds up the parity-check matrix for an LDPC code on an edge-by-edge basis. A variant of PEG construction that takes the extrinsic message degree (EMD) into account is described in "Selective avoidance of cycles in irregular LDPC code construction," in IEEE Transactions on Communications, vol. 52, no. 8, pp. 1242-1247, August 2004, by Tao Tian, C. R. Jones, J. D. Villasenor and R. D. Wesel. The method is used to find cyclic shifts that give high approximate cycle EMD (ACE) values for the graph. The minimum ACE value is calculated for each cycle of length shorter or equal to a specified length.

The ACE of a length 2d cycle is defined as:

$$ACE = \sum_i (d_i - 2),$$

where $d_i$ is the degree of the ith variable node in the cycle. Furthermore, an LDPC code has property (dACE, etaACE) if all the cycles whose length is 2·dACE or less have ACE values of at least etaACE.

The shift coefficients are selected such that there are no cycles in the graph with ACE values lower than a specified ACE constraint. In this way, harmful short cycles with low connectivity to the rest of the graph can be avoided.

For a given shift size Z, the identity matrix can be shifted up to Z−1 times without producing the same Z×Z sub-block. This means that each shift coefficient can take on any value between 0 and Z−1. The larger the shift size, the more freedom the lifting algorithm has to select shift coefficients, and the more likely it is that short cycles with low ACE values can be avoided.

One possible solution is to specify one shift coefficient design for each shift size that the LDPC code is specified for. This, however, requires storage of each shift coefficient design in both the transmitter and the receiver. Another alternative, which is considered here, is to design the shift coefficients for a set of shift sizes simultaneously. The shift value $P_{i,j}$ can be calculated by a function $P_{i,j}=f(V_{i,j}, Z)$, where $V_{i,j}$ is the shift coefficient of the (i,j)-th element in the corresponding shift coefficient design. One example is the function $f$ defined as:

$$P_{i,j} = \begin{cases} -1 & \text{if } V_{i,j} == -1 \\ mod(V_{i,j}, Z) & \text{else} \end{cases}$$

but other functions may be used as well.

NR supports shift sizes Z according to Table 1. One set of values $V_{i,j}$ may be specified for each set in the table for each base matrix. The specific shift coefficient design for a given Z is found by applying the function above to the values $V_{i,j}$ that are specified for the set that Z belongs to.

TABLE 1

| Shift sizes Z that NR shall support |
|---|
| Set 1 | $Z = 2*2^j$, j = 0, 1, 2, 3, 4, 5, 6, 7 |
| Set 2 | $Z = 3*2^j$, j = 0, 1, 2, 3, 4, 5, 6, 7 |
| Set 3 | $Z = 5*2^j$, j = 0, 1, 2, 3, 4, 5, 6 |
| Set 4 | $Z = 7*2^j$, j = 0, 1, 2, 3, 4, 5 |
| Set 5 | $Z = 9*2^j$, j = 0, 1, 2, 3, 4, 5 |
| Set 6 | $Z = 11*2^j$, j = 0, 1, 2, 3, 4, 5 |
| Set 7 | $Z = 13*2^j$, j = 0, 1, 2, 3, 4 |
| Set 8 | $Z = 15*2^j$, j = 0, 1, 2, 3, 4 |

New Radio (NR) supports LDPC codes with two different base matrices, referred to as base graph 1 and base graph 2 in 3GPP TS 38.212. The first base matrix, base matrix #1, has size 46×68 and 316 edges. The second base matrix, base matrix #2, has size 42×52 and 197 edges. The base matrices are sparse and are specified below. The non-zero entries in the base graph are specified by a triple (e, r, c). The triples mean that the non-zero edge numbered e is in row r and column c. All non-zero entries in the base graph are equal to 1. All elements in the base matrix that are not specified in the sparse description are 0. The sparse format compactly describes the matrices from which the shift coefficient designs are derived.

For a general base matrix with N edges, with non-zero entries specified by a set of triples $\{(e_k, r_k, c_k)\}$ and a vector $[a_1, \ldots, a_N]$ of length N, $V_{i,j}$ takes the values $V_{r_k,c_k}=a_{c_k}$ for $(e_k, r_k, c_k)$ in the set of triples, and $V_{i,j}=-1$ for other (i,j).

To describe a set of $V_{i,j}$ for base matrix #1, all that is needed is a vector of length 316 whose entries are integers. If the vector is $[a\_1, a\_2, a\_3, \ldots, a\_316]$, this means that $V_{i,j}$ takes the values $V_{1,1}=a\_1$, $V_{1,2}=a\_2$, $V_{1,3}=a\_3$, $V_{1,4}=a\_4, V_{1,6}=a\_5, \ldots, V_{46,68}=a\_316$, for (i,j) given in the base matrix description, with $V_{i,j}=-1$ for other (i,j). Together with the formula for determining $P_{i,j}$ from $V_{i,j}$ and Z and the set of Z, this completely specifies the PCMs.

LDPC Base Matrix #1 for NR (1, 1, 1) (2, 1, 2) (3, 1, 3) (4, 1, 4) (5, 1, 6) (6, 1, 7) (7, 1, 10) (8, 1, 11) (9, 1, 12) (10, 1, 13) (11, 1, 14) (12, 1, 16) (13, 1, 17) (14, 1, 19) (15, 1, 20) (16, 1, 21) (17, 1, 22) (18, 1, 23) (19, 1, 24) (20, 2, 1) (21, 2, 3) (22, 2, 4) (23, 2, 5) (24, 2, 6) (25, 2, 8) (26, 2, 9) (27, 2, 10) (28, 2, 12) (29, 2, 13) (30, 2, 15) (31, 2, 16) (32, 2, 17) (33, 2, 18) (34, 2, 20) (35, 2, 22) (36, 2, 23) (37, 2, 24) (38, 2, 25) (39, 3, 1) (40, 3, 2) (41, 3, 3) (42, 3, 5) (43, 3, 6) (44, 3, 7) (45, 3, 8) (46, 3, 9) (47, 3, 10) (48, 3, 11) (49, 3, 14) (50, 3, 15) (51, 3, 16) (52, 3, 18) (53, 3, 19) (54, 3, 20) (55, 3, 21) (56, 3, 25) (57, 3, 26) (58, 4, 1) (59, 4, 2) (60, 4, 4) (61, 4, 5) (62, 4, 7) (63, 4, 8) (64, 4, 9) (65, 4, 11) (66, 4, 12) (67, 4, 13) (68, 4, 14) (69, 4, 15) (70, 4, 17) (71, 4, 18) (72, 4, 19) (73, 4, 21) (74, 4, 22) (75, 4, 23) (76, 4, 26) (77, 5, 1) (78, 5, 2) (79, 5, 27) (80, 6, 1) (81, 6, 2) (82, 6, 4) (83, 6, 13) (84, 6, 17) (85, 6, 22) (86, 6, 23) (87, 6, 28) (88, 7, 1) (89, 7, 7) (90, 7, 11) (91, 7, 12) (92, 7, 14) (93, 7, 18) (94, 7, 19) (95, 7, 21) (96, 7, 29) (97, 8, 1) (98, 8, 2) (99, 8, 5) (100, 8, 8) (101, 8, 9) (102, 8, 15) (103, 8, 30) (104, 9, 1) (105, 9, 2) (106, 9, 4) (107, 9, 13) (108, 9, 17) (109, 9, 20) (110, 9, 22) (111, 9, 23) (112, 9, 25) (113, 9, 31) (114, 10, 1) (115, 10, 2) (116, 10, 11) (117, 10, 12) (118, 10, 14) (119, 10, 18) (120, 10, 19) (121, 10, 21) (122, 10, 32) (123, 11, 2) (124, 11, 3) (125, 11, 5) (126, 11, 8) (127, 11, 9) (128, 11, 13) (129, 11, 33) (130, 12, 1) (131, 12, 2) (132, 12, 13) (133, 12, 17) (134, 12, 22) (135, 12, 23) (136, 12, 24) (137, 12, 34) (138, 13, 1) (139, 13, 2) (140, 13, 11) (141, 13, 12) (142, 13, 14) (143, 13, 19) (144, 13, 35) (145, 14, 1) (146, 14, 4) (147, 14, 8) (148, 14, 21) (149, 14, 24) (150, 14, 36) (151, 15, 1) (152, 15, 13) (153, 15, 16) (154, 15, 17) (155, 15, 18) (156, 15, 22) (157, 15, 37) (158, 16, 1) (159, 16, 2) (160, 16, 11) (161, 16, 14) (162, 16, 19) (163, 16, 26) (164, 16, 38) (165, 17, 2) (166, 17, 4) (167, 17, 12) (168, 17, 21) (169, 17, 23) (170, 17, 39) (171, 18, 1) (172, 18, 15) (173, 18, 17) (174, 18, 18) (175, 18, 22) (176, 18, 40) (177, 19, 2) (178, 19, 13) (179, 19, 14) (180, 19, 19) (181, 19, 20) (182, 19, 41) (183, 20, 1) (184, 20, 2) (185, 20, 8) (186, 20, 9) (187, 20, 11) (188, 20, 42) (189, 21, 1) (190, 21, 4) (191, 21, 10) (192, 21, 12) (193, 21, 23) (194, 21, 43) (195, 22, 2) (196, 22, 6) (197, 22, 17) (198, 22, 21) (199, 22, 22) (200, 22, 44) (201, 23, 1) (202, 23, 13) (203, 23, 14) (204, 23, 18) (205, 23, 43) (206, 24, 2) (207, 24, 3) (208, 24, 11) (209, 24, 19) (210, 24, 46) (211, 23, 1) (212, 25, 4) (213, 25, 5) (214, 25, 12) (215, 25, 23) (216, 25, 47) (217, 26, 2) (218, 26, 7) (219, 26, 8) (220, 26, 15) (221, 26, 48) (222, 27, 1) (223, 27, 3) (224, 27, 5) (225, 27, 16) (226, 27, 49) (227, 28, 2) (228, 28, 7) (229, 28, 9) (230, 28, 50) (231, 29, 1) (232, 29, 5) (233, 29, 20) (234, 29, 22) (235, 29, 51) (236, 30, 2) (237, 30, 15) (238, 30, 19) (239, 30, 26) (240, 30, 52) (241, 31, 1) (242, 31, 11) (243, 31, 14) (244, 31, 25) (245, 31, 53) (246, 32, 2) (247, 32, 8) (248, 32, 23) (249, 32, 26) (250, 32, 54) (251, 33, 1) (252, 33, 13) (253, 33, 15) (254, 33, 25) (255, 33, 55) (256, 34, 2) (257, 34, 3) (258, 34, 12) (259, 34, 22) (260, 34, 56) (261, 35, 1) (262, 35, 8) (263, 35, 16) (264, 35, 18) (265, 35, 57) (266, 36, 2) (267, 36, 7) (268, 36, 13) (269, 36, 23) (270, 36, 58) (271, 37, 1) (272, 37, 15) (273, 37, 16) (274, 37, 19) (275, 37, 39) (276, 38, 2) (277, 38, 14) (278, 38, 24) (279, 38, 60) (280, 39, 1) (281, 39, 10) (282, 39, 11) (283, 39, 13) (284, 39, 61) (285, 40, 2) (286, 40, 4) (287, 40, 8) (288, 40, 20) (289, 40, 62) (290, 41, 1) (291, 41, 9) (292, 41, 18) (293, 41, 63) (294, 42, 2) (295, 42, 4) (296, 42, 10) (297, 42, 19) (298, 42, 64) (299, 43, 1) (300, 43, 5) (301, 43, 25) (302, 43, 65) (303, 44, 2) (304, 44, 17) (305, 44, 19) (306, 44, 26) (307, 44, 66) (308, 45, 1) (309, 45, 8) (310, 45, 10) (311, 45, 23) (312, 45, 67) (313, 46, 2) (314, 46, 7) (315, 46, 11) (316, 46, 68)

LDPC Base Matrix #2 for NR (1, 1, 1) (2, 1, 2) (3, 1, 3) (4, 1, 4) (5, 1, 7) (6, 1, 10) (7, 1, 11) (8, 1, 12) (9, 2, 1) (10, 2, 4) (11, 2, 5) (12, 2, 6) (13, 2, 7) (14, 2, 8) (15, 2, 9) (16, 2, 10) (17, 2, 12) (18, 2, 13) (19, 3, 1) (20, 3, 2) (21, 3, 4) (22, 3, 5) (23, 3, 9) (24, 3, 11) (25, 3, 13) (26, 3, 14) (27, 4, 2) (28, 4, 3) (29, 4, 5) (30, 4, 6) (31, 4, 7) (32, 4, 8) (33, 4, 9) (34, 4, 10) (35, 4, 11) (36, 4, 14) (37, 5, 1) (38, 5, 2) (39, 5, 17) (40, 5, 15) (41, 6, 1) (42, 6, 2) (43, 6, 6) (44, 6, 8) (45, 6, 12) (46, 6, 16) (47, 7, 1) (48, 7, 6) (49, 7, 8) (50, 7, 10) (51, 7, 12) (52, 7, 17) (53, 8, 2) (54, 8, 6) (55, 8, 8) (56, 8, 12) (57, 8, 14) (58, 8, 18) (59, 9, 1) (60, 9, 2) (61, 9, 13) (62, 9, 19) (63, 10, 2) (64, 10, 9) (65, 10, 11) (66, 10, 12) (67, 10, 20) (68, 11, 1) (69, 11, 2) (70, 11, 7) (71, 11, 8) (72, 11, 21) (73, 12, 1) (74, 12, 8) (75, 12, 10) (76, 12, 14) (77, 12, 22) (78, 13, 2) (79, 13, 4) (80, 13, 12) (81, 13, 23) (82, 14, 1) (83, 14, 2) (84, 14, 9) (83, 14, 14) (86, 14, 24) (87, 15, 2) (88, 15, 7) (89, 15, 12) (90, 15, 14) (91, 15, 25) (92, 16, 1) (93, 16, 11) (94, 16, 12) (95, 16, 26) (96, 17, 2) (97, 17, 10) (98, 17, 12) (99, 17, 130 (100, 17, 27) (101, 18, 2) (102, 18, 6) (103, 18, 12) (104, 111, 13) (105, 18, 28) (106, 19, 1) (107, 19, 7) (108, 19, 8) (109, 19, 29) (110, 20, 1) (111, 20, 2) (112, 20, 11) (113, 20, 30) (114, 21, 2) (115, 21, 5) (116, 21, 12) (117, 21, 31) (118, 22, 1) (119, 22, 9) (120, 22, 14) (121, 22, 32) (127, 23, 2) (123, 23, 3) (124, 23, 33) (125, 24, 1) (126, 24, 4) (127, 24, 6) (128, 24, 34) (129, 25, 2) (130, 25, 3) (131, 25, 10) (132, 25, 35) (133, 26, 1) (134, 26, 6) (135, 26, 36) (136, 27, 3) (137, 27, 8) (138, 27, 13) (139, 27, 14) (140, 27, 37) (141, 28, 1) (142, 28, 7) (143, 28, 38) (144, 29, 2) (145, 29, 3) (146, 39, 6) (147, 29, 39) (148, 30, 1) (149, 30, 5) (150, 30, 40) (151, 31, 3) (152, 31, 6) (153, 31, 8) (154, 31, 10) (155, 31, 41) (156, 32, 2) (157, 32, 14) (158, 32, 42) (159, 33, 1) (160, 33, 6) (161, 33, 13) (162, 33, 43) (163, 34, 3) (164, 34, 8) (165, 34, 11) (166, 34, 44) (167, 35, 1) (168, 35, 13) (169, 35, 14) (170, 35, 45) (171, 36, 2) (172, 36, 6) (173, 36, 12) (174, 30, 46) (175, 37, 1) (176, 37, 3) (177, 37, 8) (178, 37, 47) (179, 38, 11) (180, 38, 14) (181, 38, 48) (182, 39, 2) (183, 39, 6) (184, 39, 12) (185, 39, 49) (186, 40, 1) (187, 40, 8) (188, 40, 13) (189, 40, 50) (190, 41, 3) (191, 41, 11) (192, 41, 14) (193, 41, 51) (194, 42, 2) (195, 42, 6) (196, 42, 12) (197, 42, 52)

A problem with existing solutions is that ACE constraints for the full parity-check matrix (PCM) are typically considered in the lifting process. However, ACE values that are high for the full PCM with low code rate still allow harmful cycles in the high-rate part of a rate-compatible LDPC code that is designed through code extension. Furthermore, the constraints are set such that any cycles of a specific length or shorter should fulfill a certain ACE constraint. It is typically difficult to find cyclic shifts that fulfill tough ACE constraints for large cycles and the ACE constraint may have to be reduced, thereby allowing also harmful short cycles with lower connectivity.

SUMMARY

The embodiments described herein include a lifting method with different approximate cycle extrinsic message degree (ACE) constraints for different code rates which correspond to submatrices of a parity-check matrix. Particular embodiments include different ACE constraints for different cycle lengths, to ensure that short cycles have higher connectivity than the longer, less harmful, cycles. Furthermore, particular embodiments specify and optimize the ACE constraints for each shift size separately, because higher ACE values can be achieved for large shift sizes than for small.

According to some embodiments, a method for use in a wireless transmitter of a wireless communication network comprises encoding (e.g., LDPC) information bits using a PCM and transmitting the encoded information bits to a wireless receiver. The PCM is optimized according to two or more ACE constraints.

According to some embodiments, a wireless transmitter comprises processing circuitry operable to encode (e.g., LDPC) information bits using a PCM and transmit the encoded information bits to a wireless receiver. The PCM is optimised according to two or more ACE constraints.

According to some embodiments, a method for use in a wireless receiver of a wireless communication network comprises receiving encoded information bits from a wireless transmitter and decoding the information bits using a PCM. The decoding uses a PCM optimized according to two or more ACE constraints.

According to some embodiments, a wireless receiver comprises processing circuitry operable to receive encoded information bits from a wireless transmitter and decode the information bits using a PCM. Tice decoding uses a PCM optimized according to two or more ACE constraints.

In particular embodiments, the PCM is lifted from a base matrix and the shift coefficients used for lifting were selected to satisfy particular ACE constraints that vary for different portions of the PCM. The two or more ACE constraints vary according to code rate, cycle length, shift size, and/or systematic bits and parity bits.

In particular embodiments, a first portion of the PCM is optimized according to a first ACE constraint of the two or more ACE constraints and a second portion of the PCM is optimized according to a second ACE constraint of the two or more ACE constraints. The first portion of the PCM may comprise a high-rate portion and the second portion of the PCM may comprise a low-rate portion. The first portion of the PCM may be optimized according to two or more ACE constraints and the second portion of the PCM may be optimized according to two or more ACE constraints.

In particular embodiments, the wireless transmitter is a network node or a wireless device. The wireless transmitter may comprise a network node or a wireless device.

According to some embodiments, a wireless transmitter comprises an encoding module and a transmitting module. The encoding module is operable to encode information bits using a PCM. The transmitting module is operable to transmit the encoded information bits to a wireless receiver. The PCM is optimized according to two or more ACE constraints.

According to some embodiments, a wireless receiver comprises a decoding module and a receiving module. The receiving module is operable to receive encoded information bits from a wireless transmitter. The decoding module is operable to decode the information bits using a PCM. The decoding uses a PCM optimized according to two or more ACE constraints.

Also disclosed is a computer program product. The computer program product comprises instructions stored on non-transient computer-readable media which, when executed by a processor, perform the steps of encoding (e.g., LDPC) information bits using a PCM and transmitting the encoded information bits to a wireless receiver. The PCM is optimized according to two or more ACE constraints.

Another computer program product comprises instructions stored on non-transient computer-readable media which, when executed by a processor, perform the steps of receiving encoded information bits from a wireless transmitter and decoding the information bits using a PCM. The decoding uses a PCM optimized according to two of more ACE constraints.

An advantage of the lifting methods of particular embodiments and the LDPC codes designed using those methods is that the block-error rate performance, especially in the error-floor region, is improved. Some embodiments may include additional or other advantages.

BRIEF DESCRIPTION OF THE DRAWINGS

For a more complete understanding of the embodiments and their features and advantages, reference is now made to the following description, taken in conjunction with the accompanying drawings, in which:

FIG. 5A is a block diagram illustrating an example embodiment of a network node; and FIG. 5B is a block diagram illustrating example components of a network node.

DETAILED DESCRIPTION

Figure 1:
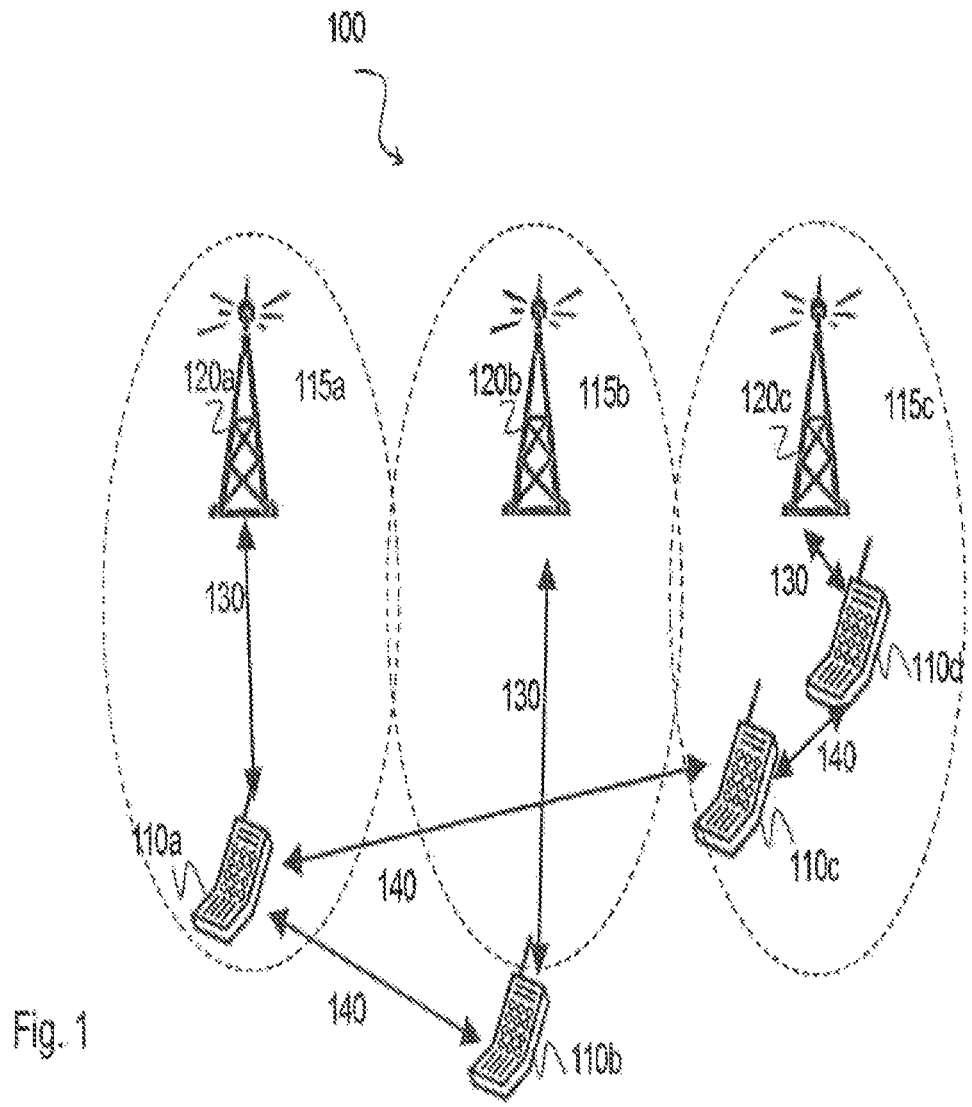
FIG. 1 is a block diagram illustrating an example wireless network, according to a particular embodiment.

Third Generation Partnership Project (3GPP) 5G New Radio (NR) supports low-density parity check (LDPC) codes with two different base matrices. The first base matrix has size 46×68, and the second base matrix has size 42×52. One method for constructing a parity-check matrix (PCM) from a base matrix is the progressive edge growth (PEG) algorithm. A variant of PEG construction that takes the extrinsic message degree (EMD) into account is used to find cyclic shifts that give high approximate cycle EMD (ACE) values for the graph. The minimum ACE value is calculated for each cycle of length shorter or equal to a specified length.

An LDPC code has property (dACE, etaACE). If all the cycles whose length is 2-dACE or less have ACE values of at least etaACE. The shift coefficients are selected such that there are no cycles in the graph with ACE values lower than a specified ACE constraint. In this way, harmful short cycles with low connectivity to the rest of the graph can be avoided.

One possible solution is to specify one shift coefficient design for each shift size that the LDPC code is specified for. This, however, inquires storage of each shift coefficient design in both the transmitter and the receiver. Another alternative, which is considered here, is to design the shift coefficients for a set of shift sizes simultaneously.

A problem with existing solutions is that ACE constraints for the full PCM are typically considered in the lifting process. However, ACE values that are high for the full PCM with low code rate still allow harmful cycles in the high-rate part of a rate-compatible LDPC code that is designed through code extension. Furthermore, the constraints are set such that any cycles of a specific length or shorter should fulfill a certain ACE constraint. It is typically difficult to find cyclic shifts that fulfill tough ACE constraints for large cycles and the ACE constraint may have to be reduced, thereby allowing also harmful shod cycles with lower connectivity.

The embodiments described herein include a lifting method with different approximate cycle extrinsic message degree (ACE) constraints for different code rates which correspond to submatrices of a parity-check matrix. Particular embodiments include different ACE constraints for different cycle lengths, to ensure that short cycles have higher connectivity than the longer, less harmful, cycles. Furthermore, particular embodiments specify and optimize the ACE constraints for each shift size separately, because higher connectivity can be achieved for large shift sizes than for small.

An advantage of the lifting methods of particular embodiments and the LDPC codes designed using these methods is that the block-error rate performance, especially in the error-floor region, is improved.

The following description sets forth numerous specific details. It is understood, however, that embodiments may be practiced without these specific details. In other instances, well-known circuits, structures and techniques have not been shown in detail in order not to obscure the understanding of this description. Those of ordinary skill in the art, with the included descriptions, will be able to implement appropriate functionality without undue experimentation.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to implement such feature, structure, or characteristic in connection with other embodiments, whether or not explicitly described.

Particular embodiments are described with reference to FIGS. 1-5B of the drawings, like numerals being used for like and corresponding parts of the various drawings. LTE and NR are used throughout this disclosure as an example cellular system, but the ideas presented herein may apply to other wireless communication systems as well.

FIG. 1 is a block diagram illustrating an example wireless network, according to a particular embodiment. Wireless network 100 includes one or more wireless devices 110 (such as mobile phones, smart phones, laptop computers, tablet computers, MTC devices, V2X devices, or any other devices that can provide wireless communication) and a plurality of network nodes 120 (each as base stations, eNodeBs, gNBs, etc.). Wireless device 110 may also be referred to as a UE. Network node 120 serves coverage area 115 (also referred to as cell 115).

In general, wireless devices 110 that are within coverage of network node 120 (e.g., within cell 115 served by network node 120) communicate with network node 120 by transmitting and receiving wireless signals 130. For example, wireless devices 110 and network node 120 may communicate wireless signals 130 containing voice traffic, data traffic, and/or control signals.

A network node 120 communicating voice traffic, data traffic, and/or control signals to wireless device 110 may be referred to as a serving network node 120 for the wireless device 110. Communication between wireless device 110 and network node 120 may be referred to as cellular communication. Wireless signals 130 may include both downlink transmissions (from network node 120 to wireless devices 110) and uplink transmissions (from wireless devices 110 to network node 120). In LTE, the interface for communicating wireless signals between network node 120 and wireless device 110 may be referred to as a Uu interface.

Each network node 120 may have a single transmitter or multiple transmitters for transmitting signals 130 to wireless devices 110. In some embodiments, network node 120 may comprise a multi-input multi-output (MIMO) system. Wireless signal 130 may comprise one or more beams. Particular beams may be beamformed in a particular direction. Similarly, each wireless device 110 may have a single receiver or multiple receivers for receiving signals 130 from network nodes 120 or other wireless devices 110. Wireless device may receive one or more beams comprising wireless signal 130.

Wireless devices 110 may communicate with each other (i.e., D2D operation) by transmitting and receiving wireless signals 140. For example, wireless device 110a may communicate with wireless device 110b using wireless signal 140. Wireless signal 140 may also be referred to as sidelink 140. Communication between two wireless devices 110 may be referred to as D2D communication or sidelink communication. In LTE, the interface for communicating wireless signal 140 between wireless devices 110 may be referred to as a PC5 interface.

Wireless signals 130 end 140 may be transmitted on time-frequency resources. The time-frequency resources may be partitioned into radio flames, subframes, slots, and/or mini-slots. Data may be scheduled for transmission based on the partitions. For example, data transmissions may be scheduled based on subframe, slot, or mini-slot. Wireless signals 130 may include reference signals, such as DM-RS.

Wireless signals 130 and 140 may be encoded using an LDPC. The particular LDPC may be determined by a lifting method where the shift coefficients are determined based on ACE constraints that may vary based on a number of different code rates, a shift size Z, different cycle lengths, and/or separately for systematic bits and parity bits. More specific examples are described below.

Wireless device 110, network node 120, or any other component of network 100 that transmits wireless signals may be referred to as a wireless transmitter. Wireless device 110, network node 120, or any other component of network 100 that receives wireless signals may be referred to as a wireless receiver.

In wireless network 100, each network node 120 may use any suitable radio access technology, such as lung term evolution (LTE), 5G NR, LTE-Advanced, UMTS, HSPA, GSM, cdma2000, NR, WiMax, WiFi, and/or other suitable radio access technology. Wireless network 100 may include any suitable combination of one or more radio access technologies. For purposes of example, various embodiments may be described within the context of certain radio access technologies. However, the scope of the disclosure is not limited to the examples and other embodiments could use different radio access technologies.

As described above, embodiments of a wireless network may include one or more wireless devices and one or more different types of radio network nodes capable of communicating with the wireless devices. The network may also include any additional elements suitable to support communication between wireless devices or between a wireless device and another communication device (such as a landline telephone). A wireless device may include any suitable combination of hardware and/or software. For example, in particular embodiments, a wireless device, such as wireless device 110, may include the components described with respect to FIG. 4A below. Similarly, a network node may include any suitable combination of hardware and/or software. For example, in particular embodiments, a network node, such as network node 120, may include the components described with respect to FIG. 5A below.

In particular embodiments, a lifting method for quasi-cyclic codes selects the shift coefficients for one non-zero entry in the base matrix (also referred to as a base graph) at a time. For each non-zero entry in the base matrix, a shift coefficient is selected randomly (i.e., a value between 0 and $Z-1$ is selected). The ACE detection algorithm described in the Introduction is used to avoid cycles that do not fulfill specific ACE constraints. This may be performed by checking all the ACE constraints for the edges in the matrix that have already been selected, including the edges corresponding to the shift coefficient that is currently considered. If cycles not fulfilling the constraints are added to the graph through the latest selected shift coefficient, a new random value of this shift coefficient is considered instead. This procedure continues until a shift coefficient that fulfills all the ACE constraints has been found.

Particular embodiments include advantages over conventional lifting methods because: (a) ACE constraints may be specified for a number of different code rates; (b) ACE constraints may be specified for each shift size Z; (c) ACE constraints may be specified for several different cycle lengths; and (d) ACE constraints may be specified separately for systematic bits and parity bits.

An example base matrix is specified in Table 2. The example is a submatrix of base matrix #2 described above.

TABLE 2

Example base matrix

```
1 1 1 1 0 0 1 0 0 1 1 1 0 0 0 0 0 0 0 1 1 1
1 0 0 1 1 1 1 1 1 1 0 1 1 0 0 0 0 0 0 1 0 0
1 1 0 0 0 0 0 0 0 1 0 0 1 1 0 0 0 0 0 1 1 0
1 1 0 1 1 0 0 0 1 0 1 0 1 1 0 0 0 0 0 1 1 0
0 1 1 0 1 1 1 1 1 1 1 0 0 1 0 0 0 0 0 0 1 1
1 1 0 0 0 0 0 0 0 0 0 1 0 0 1 0 0 0 0 1 1 0
1 1 0 0 0 1 0 1 0 0 0 1 0 0 0 1 0 0 0 0 1 1 0
1 0 0 0 0 1 0 1 0 1 0 1 0 0 0 0 1 0 0 0 1 0 0
0 1 0 0 0 1 0 1 0 0 0 0 1 0 1 0 0 0 1 0 0
1 1 0 0 0 0 0 0 0 0 0 0 1 0 0 0 0 0 1 0 1 1 0
0 1 0 0 0 0 0 0 1 0 1 1 0 0 0 0 0 0 0 1 0 1 0
1 1 1 1 0 0 1 0 0 1 1 1 0 0 0 0 0 0 0 1 1 1
1 0 0 1 1 1 1 1 1 1 0 1 1 0 0 0 0 0 0 1 0 0
1 1 0 1 1 0 0 0 1 0 1 0 1 1 0 0 0 0 0 1 1 0
```

Table 2 includes two different rectangles. The smaller rectangle in the upper left corner corresponds to a higher code rate and the full base matrix corresponds to a lower code rate. The lifting method of particular embodiments is based on a search for shift coefficients that fulfill certain ACE constraints. Since the ACE value for a cycle depends on the variable node degree, calculated as the column weight of the base matrix, it is clear that a larger base matrix that corresponds to a lower code rate, has higher variable node degrees and thereby also higher ACE values. By constraining the ACE values for different code rates, i.e. different sized sub-matrices, particular embodiments ensure that the lifting is optimal not only for the lowest code rate that the base matrix defines, but also for higher code rates.

The shift size is also of importance when selecting the ACE constraints that should be fulfilled for the selected shift coefficient design. Because the lifting algorithm has more freedom in the selection of the shift coefficients if the shift size is large, shift coefficient designs that fulfill higher ACE constraints for a certain cycle length, or that fulfill ACE constraints for longer cycle lengths may be found if the shift size Z is increased. Particular embodiments, therefore, specify separate ACE constraints for each shift size Z. This makes it possible to fully use the freedom of shift coefficient selection for each shift size and achieve higher ACE values, which is highly related to improved BLER performance, for the larger shift sizes.

Furthermore, the ACE-based lifting method described in the Introduction uses a single ACE value that all cycles of a specified length or shorter should fulfill. Particular embodiments described herein define a number of ACE constraints for different cycle lengths, to make it possible to place harder constraints (larger required ACE values) on shorter cycles and relaxing them a bit for longer cycles. Because it is not possible to avoid all cycles, this facilitates optimization of the connectivity of cycles of different lengths.

Particular embodiments include base matrices that have a special submatrix structure in the first set of parity bits of the following form:

| 1 | 1 | 0 | 0 |
|---|---|---|---|
| 1 | 1 | 1 | 0 |
| 0 | 0 | 1 | 1 |
| 1 | 0 | 0 | 1 | or

| 1 | 1 | 0 | 0 |
|---|---|---|---|
| 0 | 1 | 1 | 0 |
| 1 | 0 | 1 | 1 |
| 1 | 0 | 0 | 1 | where the shift coefficients are chosen as follows, with A and B being integers between 0 and $Z-1$. We will typically choose A=1 and B=0:

| A  | 0  | −1 | −1 |
|----|----|----|----|
| B  | 0  | 0  | −1 |
| −1 | −1 | 0  | 0  |
| A  | −1 | −1 | 0  | or

|   |    |    |    |
|---|----|----|----|
| A |  0 | −1 | −1 |
| −1|  0 |  0 | −1 |
| B | −1 |  0 |  0 |
| A | −1 | −1 |  0 |

This submatrix structure can be seen in Table 2 in the bold elements.

This structure gives rise to Z cycles of length 2d, where d is the number of rows in the (square) submatrix, with ACE=1 for the code rates using this part of the matrix. Therefore, it is not possible to satisfy higher constraints than etaACE=1 for dACE=4, even though other shift coefficients can be chosen so that cycles involving the corresponding variable nodes have higher ACE.

Even though fairly short cycles with low ACE value cannot be avoided when using this structure, it is often used anyhow because of the simple encoding procedure that can be used. The following description assumes that A=1, β=0, and that all the shift coefficients for the dual diagonal shown in the special submatrix structure are set to 0. Furthermore, the shift coefficients for the diagonal extension part of the base matrix (lower right corner of the matrix) are all set to 0. The shift coefficients selected for the diagonal extension part are not important for the BLER performance of the code because they correspond to variable nodes of degree 1 and cannot be part of any cycles. Optimization of these shift coefficients is therefore not necessary.

However, because of the cycle of length 8 (dACE=4) with etaACE=1 that is already present in the matrix, it is not possible to set harder constraints for this cycle length or longer and for the highest code rate that the matrix is specified for. It is possible, however, to avoid cycles that contain the three rightmost columns in the structure above, and other columns in the matrix. Such columns are found in the systematic part of the base matrix, which correspond to the columns left to the matrix with the special submatrix structure marked in bald. To be able to avoid these cycles in the optimization of the shift coefficients, particular embodiments specify different ACE constraints for when starting ACE detection from variable nodes in the systematic part and from variable nodes in the parity part, where the ACE constraints starting for the systematic part may be higher.

For both base matrix 1 and 2 described above, the column weights of the first two columns (or equivalently variable nodes) are higher than for the other columns. Typically, it is good to avoid at least all cycles of length 4. However, for small shift sizes Z where the freedom in the selection of shift coefficients is small, this may not be possible. For this code rate, it may in this case be advantageous to allow only length-4 cycles involving the two first variable nodes of the base matrix that have the highest variable node degree. This can be enforced by selecting an ACE constraint with dACE=2 and choosing etaACE such that length 4 cycles containing other variable nodes automatically violate this constraint. If a lower rate, corresponding to using more rows of the base matrix, is considered, a higher etaACE can typically be achieved since the variable node degrees are higher for this submatrix. However, a similar etaACE constraint can be chosen for this rate to enforce that any length 4 cycles only involve nodes from the first two columns.

For a larger shift size Z, it may be possible to avoid all length-4 cycles. It is therefore advantageous to have different ACE constraints for the different shift sizes. In this small example, particular embodiments may, for example, select shift coefficients for shift size Z>10 that avoid all length-4 cycles, i.e. dACE=2 and etaACE-Infinity (also denoted by Inf below).

To find proper etaACE constraints to set, several initial ACE-constraints were tried. Shift coefficient designs satisfying in general higher ACE constraints were chosen if the method found a suitable candidate. Among candidates with similar ACE-constraints, the final choice of PCMs was made after studying the BLER performance of the PCMs. Note that ACE-constraints differing in different shift sizes or dACE are not easily ordered, because placing higher constraints on a particular code rate or Z value might lead to other constraints being harder to satisfy. Therefore, the final choice was carried out among PCMs satisfying roughly similar constraints.

The matrices belonging to set #3 for base graph 1 fulfills the following etaACE constraints for different code rates (corresponding to using a smaller submatrix) when the ACE-detection is started at a systematic variable node for Z=40.

| etaACE for Z = 40 | dACE = 2 | dACE = 3 | dACE = 4 |
|---|---|---|---|
| Rate 8/9 | Inf | 3  | 2  |
| Rate 5/6 | Inf | 4  | 2  |
| Rate 3/4 | Inf | 5  | 3  |
| Rate 2/3 | Inf | 6  | 5  |
| Rate 1/2 | Inf | 9  | 8  |
| Rate 2/5 | Inf | 13 | 10 |
| Rate 1/3 | Inf | 14 | 14 |

The matrices belonging to set #3 for base graph 1 fulfills the following etaACE constraints for different code rates (corresponding to using a smaller submatrix) and shift sizes, when the ACE-detection is started at a systematic variable node for Z=80.

| etaACE for Z = 80 | dACE = 2 | dACE = 3 | dACE = 4 |
|---|---|---|---|
| Rate 8/9 | Inf | 3  | 2  |
| Rate 5/6 | Inf | 4  | 3  |
| Rate 3/4 | Inf | 6  | 4  |
| Rate 2/3 | Inf | 7  | 5  |
| Rate 1/2 | Inf | 10 | 8  |
| Rate 2/5 | Inf | 14 | 11 |
| Rate 1/3 | Inf | 16 | 15 |

The matrices belonging to set #3 for base graph 1 fulfills the following etaACE constraints for different code rates (corresponding to using a smaller submatrix) when the ACE-detection is started at a systematic variable node for Z=160

| etaACE for Z = 160 | dACE = 2 | dACE = 3 | dACE = 4 |
|---|---|---|---|
| Rate 8/9 | Inf | 3  | 3  |
| Rate 5/6 | Inf | 5  | 3  |
| Rate 3/4 | Inf | 7  | 5  |
| Rate 2/3 | Inf | 8  | 5  |
| Rate 1/2 | Inf | 10 | 9  |
| Rate 2/5 | Inf | 14 | 13 |
| Rate 1/3 | Inf | 18 | 16 |

The matrices belonging to set #3 for base graph 1 fulfills the following etaACE constraints for different code rates (corresponding to using a smaller submatrix) when the ACE-detection is started at a systematic variable node for Z=320

| etaACE for Z = 320 | dACE = 2 | dACE = 3 | dACE = 4 |
|---|---|---|---|
| Rate 8/9 | Inf | Inf | 3 |
| Rate 5/6 | Inf | Inf | 3 |
| Rate 3/4 | Inf | 9 | 5 |
| Rate 2/3 | Inf | 10 | 6 |
| Rate 1/2 | Inf | 16 | 10 |
| Rate 2/5 | Inf | 20 | 13 |
| Rate 1/3 | Inf | 21 | 17 |

The matrices belonging to set #3 for base graph 1 fulfills the following etaACE constraints for different code rates (corresponding to using a smaller submatrix) when the ACE-detection is started at a parity variable node for Z=40

| etaACE for Z = 40 | dACE = 2 | dACE = 3 | dACE = 4 |
|---|---|---|---|
| Rate 8/9 | Inf | 3 | 1 |
| Rate 5/6 | Inf | 4 | 2 |
| Rate 3/4 | Inf | 5 | 3 |
| Rate 2/3 | Inf | 6 | 5 |
| Rate 1/2 | Inf | 9 | 8 |
| Rate 2/5 | Inf | 13 | 11 |
| Rate 1/3 | Inf | 16 | 15 |

The matrices belonging to set #3 for base graph 1 fulfills the following etaACE constraints for different code rates (corresponding to using a smaller submatrix) when the ACE-detection is started at a parity variable node for Z=80

| etaACE for Z = 80 | dACE = 2 | dACE = 3 | dACE = 4 |
|---|---|---|---|
| Rate 8/9 | Inf | 3 | 1 |
| Rate 5/6 | Inf | 5 | 2 |
| Rate 3/4 | Inf | 6 | 4 |
| Rate 2/3 | Inf | 7 | 5 |
| Rate 1/2 | Inf | 10 | 8 |
| Rate 2/5 | Inf | 15 | 12 |
| Rate 1/3 | Inf | 16 | 15 |

The matrices belonging to set #3 for base graph 1 fulfills the following etaACE constraints for different code rates (corresponding to using a smaller submatrix) when the ACE-detection is started at a parity variable node for Z=160

| etaACE for Z = 160 | dACE = 2 | dACE = 3 | dACE = 4 |
|---|---|---|---|
| Rate 8/9 | Inf | 3 | 1 |
| Rate 5/6 | Inf | 5 | 2 |
| Rate 3/4 | Inf | 7 | 4 |
| Rate 2/3 | Inf | 8 | 6 |
| Rate 1/2 | Inf | 10 | 9 |
| Rate 2/5 | Inf | 15 | 13 |
| Rate 1/3 | Inf | 20 | 16 |

The matrices belonging to act #3 for base graph 1 fulfills the following etaACE constraints for different code rates (corresponding to using a smaller submatrix) when the ACE-detection is started at a parity variable node for Z=320

| etaACE for Z = 320 | dACE = 2 | dACE = 3 | dACE = 4 |
|---|---|---|---|
| Rate 8/9 | Inf | Inf | 1 |
| Rate 5/6 | Inf | Inf | 2 |
| Rate 3/4 | Inf | 9 | 4 |
| Rate 2/3 | Inf | 11 | 6 |

-continued

| etaACE for Z = 320 | dACE = 2 | dACE = 3 | dACE = 4 |
|---|---|---|---|
| Rate 1/2 | Inf | 18 | 10 |
| Rate 2/5 | Inf | 23 | 13 |
| Rate 1/3 | Inf | 21 | 18 |

The initial constraints for matrices belonging to set #3 for base graph 1 for different code rates (corresponding to using a smaller submatrix) when the ACE-detection is started at a systematic variable node for Z=40 where

| etaACE for Z = 40 | dACE = 2 | dACE = 3 | dACE = 4 |
|---|---|---|---|
| Rate 8/9 | Inf | 3 | 2 |
| Rate 5/6 | Inf | 3 | 2 |
| Rate 3/4 | Inf | 4 | 3 |
| Rate 2/3 | Inf | 5 | 4 |
| Rate 1/2 | Inf | 7 | 7 |
| Rate 2/5 | Inf | 12 | 10 |
| Rate 1/3 | Inf | 13 | 12 |

The initial constraints for matrices belonging to set #3 for base graph 1 for different code rates (corresponding to using a smaller submatrix) when the ACE-detection is started at a systematic variable node for Z=80 where

| etaACE for Z = 80 | dACE = 2 | dACE = 3 | dACE = 4 |
|---|---|---|---|
| Rate 8/9 | Inf | 3 | 2 |
| Rate 5/6 | Inf | 4 | 2 |
| Rate 3/4 | Inf | 5 | 3 |
| Rate 2/3 | Inf | 6 | 4 |
| Rate 1/2 | Inf | 8 | 7 |
| Rate 2/5 | Inf | 13 | 8 |
| Rate 1/3 | Inf | 14 | 12 |

The initial constraints for matrices belonging to set #3 for base graph 1 for different code rates (corresponding to using a smaller submatrix) when the ACE-detection is started at a systematic variable node for Z=160 where

| etaACE for Z = 160 | dACE = 2 | dACE = 3 | dACE = 4 |
|---|---|---|---|
| Rate 8/9 | Inf | 3 | 3 |
| Rate 5/6 | Inf | 4 | 3 |
| Rate 3/4 | Inf | 6 | 4 |
| Rase 2/3 | Inf | 7 | 5 |
| Rate 1/2 | Inf | 9 | 8 |
| Rate 2/5 | Inf | 13 | 11 |
| Rate 1/3 | Inf | 16 | 15 |

The initial constraints for matrices belonging to set #3 for base graph 1 for different code rates (corresponding to using a smaller submatrix) when the ACE-detection is started at a systematic variable node for Z=320 where

| etaACE for Z = 320 | dACE = 2 | dACE = 3 | dACE = 4 |
|---|---|---|---|
| Rate 8/9 | Inf | Inf | 3 |
| Rate 5/6 | Inf | Inf | 3 |
| Rate 3/4 | Inf | 8 | 4 |
| Rate 2/3 | Inf | 9 | 5 |
| Rate 1/2 | Inf | 15 | 8 |
| Rate 2/5 | Inf | 18 | 12 |
| Rate 1/3 | Inf | 21 | 15 |

The initial constraints for submatrices containing the first four parity nodes in the base graph belonging to set #3 for base graph 1 for different code rates (corresponding to using a smaller submatrix) when the ACE-detection is started at a parity variable node for Z=40 where

| etaACE for Z = 40 | dACE = 2 | dACE = 3 | dACE = 4 |
| --- | --- | --- | --- |
| Rate 8/9 | Inf | 3 | 1 |
| Rate 5/6 | Inf | 4 | 2 |
| Rate 3/4 | Inf | 4 | 3 |
| Rate 2/3 | Inf | 5 | 4 |
| Rate 1/2 | Inf | 9 | 7 |
| Rate 2/5 | Inf | 12 | 10 |
| Rate 1/3 | Inf | 14 | 13 |

The initial constraints for submatrices containing the first four parity nodes in the base graph belonging to set #3 for base graph 1 for different code rates (corresponding to using a smaller submatrix) when the ACE-detection is started at a parity variable node for Z=80 where

| etaACE for Z = 80 | dACE = 2 | dACE = 3 | dACE = 4 |
| --- | --- | --- | --- |
| Rate 8/9 | Inf | 3 | 1 |
| Rate 5/6 | Inf | 4 | 2 |
| Rate 3/4 | Inf | 6 | 3 |
| Rate 2/3 | Inf | 7 | 4 |
| Rate 1/2 | Inf | 10 | 7 |
| Rate 2/5 | Inf | 16 | 11 |
| Rate 1/3 | Inf | 19 | 13 |

The initial constraints for submatrices containing the first four parity nodes in the base graph belonging to set #3 for base graph 1 for different code rates (corresponding to using a smaller submatrix) when the ACE-detection is started at a parity variable node for 2-160 where

| etaACE for Z = 160 | dACE = 2 | dACE = 3 | dACE = 4 |
| --- | --- | --- | --- |
| Rate 8/9 | Inf | Inf | 1 |
| Rate 5/6 | Inf | Inf | 2 |
| Rate 3/4 | Inf | 6 | 4 |
| Rate 2/3 | Inf | 8 | 5 |
| Rate 1/2 | Inf | 12 | 8 |
| Rate 2/5 | Inf | 16 | 12 |
| Rate 1/3 | Inf | 20 | 15 |

The initial constraints for submatrices containing the first four parity nodes in the base graph belonging to set #3 for base graph 1 for different code rates (corresponding to using a smaller submatrix) when the ACE-detection is started at a parity variable node for Z=320 where

| etaACE for Z = 320 | dACE = 2 | dACE = 3 | dACE = 4 |
| --- | --- | --- | --- |
| Rate 8/9 | Inf | Inf | 1 |
| Rate 5/6 | Inf | Inf | 2 |
| Rate 3/4 | Inf | Inf | 4 |
| Rate 2/3 | Inf | 16 | 5 |
| Rate 1/2 | Inf | 27 | 8 |
| Rate 2/5 | Inf | 35 | 14 |
| Rate 1/3 | Inf | 43 | 16 |

Note that variable nodes in the base graph and variable nodes in the full PCM after lifting are not the same thing. In general, if there are N variable nodes in the base graph, there will be N*2 variable nodes after lifting.

New Radio (NR) includes two different base matrices that describe the structure of the LDPC codes. However, the corresponding shift coefficient designs that are as important for the performance of the LDPC codes have not been specified. Particular embodiments use the ACE constraints to find a shift coefficient design with good performance that avoids harmful cycles and improves the BLER performance. In particular embodiments, different ACE constraints may be used for the systematic bits and the parity bits. The following examples are the result of applying the lifting algorithm to base matrix #1 and #2 specified for NR. The format of the example vectors below is described above in the Introduction.

BG #1: Vector for Set 1

4, 175, 110, 199, 65, 149, 58, 24, 234, 204, 230, 154, 79, 207, 97, 124, 124, 1, 0, 116, 3, 42, 255, 57, 250, 165, 73, 104, 242, 111, 77, 144, 253, 234, 94, 0, 0, 0, 28, 50, 136, 83, 151, 172, 40, 78, 19, 131, 243, 222, 42, 210, 51, 156, 120, 0, 0, 251, 216, 5, 27, 91, 25, 103, 76, 20, 201, 9, 19, 61, 112, 71, 99, 14, 1, 0, 60, 124, 0, 33, 128, 140, 26, 113, 168, 203, 0, 158, 177, 174, 245, 144, 213, 145, 43, 0, 201, 247, 40, 232, 253, 55, 0, 120, 58, 11, 146, 46, 190, 12, 219, 21, 0, 106, 186, 143, 174, 243, 15, 136, 250, 0, 106, 240, 79, 200, 209, 13, 0, 93, 135, 20, 42, 133, 54, 52, 0, 103, 54, 47, 12, 110, 34, 0, 254, 58, 15, 224, 98, 0, 195, 179, 155, 162, 244, 113, 0, 95, 172, 183, 53, 100, 233, 0, 172, 108, 191, 112, 111, 0, 105, 122, 96, 98, 4, 0, 17, 218, 229, 135, 141, 0, 80, 235, 219, 245, 189, 0, 44, 219, 82, 103, 103, 0, 15, 236, 70, 1, 38, 0, 220, 101, 28, 105, 0, 218, 74, 201, 199, 0, 198, 228, 51, 117, 47, 0, 45, 73, 90, 209, 0, 100, 239, 137, 45, 0, 191, 176, 244, 0, 47, 87, 218, 5, 0, 12, 67, 191, 141, 0, 75, 22, 163, 180, 0, 207, 11, 253, 201, 0, 63, 113, 10, 122, 0, 0, 25, 89, 21, 0, 206, 119, 238, 45, 0, 112, 253, 183, 161, 0, 76, 43, 104, 22, 0, 28, 153, 35, 0, 130, 176, 193, 159, 0, 20, 100, 23, 221, 0, 190, 158, 38, 0, 127, 136, 185, 239, 0, 139, 109, 85, 0, 234, 210, 198, 0, 0, 106, 206, 66, 24, 0, 204, 223, 47, 0

BG #1: Vector for Set 2

307, 19, 50, 369, 181, 216, 317, 288, 109, 17, 357, 215, 106, 242, 180, 330, 346, 1, 0, 76, 76, 73, 288, 144, 331, 331, 178, 295, 342, 217, 99, 354, 114, 331, 112, 0, 0, 0, 205, 250, 328, 332, 256, 161, 267, 160, 63, 129, 200, 88, 53, 131, 240, 205, 13, 0, 0, 276, 87, 0, 275, 199, 153, 56, 132, 305, 231, 341, 212, 304, 300, 271, 39, 357, 1, 0, 332, 181, 0, 195, 14, 115, 166, 241, 51, 157, 0, 278, 257, 1, 351, 92, 253, 18, 225, 0, 9, 62, 316, 333, 290, 114, 0, 307, 179, 165, 18, 39, 224, 368, 67, 170, 0, 366, 232, 321, 133, 57, 303, 63, 82, 0, 101, 339, 274, 111, 383, 354, 0, 48, 102, 8, 47, 188, 334, 115, 0, 77, 186, 174, 232, 50, 74, 0, 313, 177, 266, 115, 370, 0, 142, 248, 137, 89, 347, 12, 0, 241, 2, 210, 318, 55, 269, 0, 13, 338, 57, 289, 57, 0, 260, 303, 81, 358, 375, 0, 130, 163, 280, 132, 1, 0, 145, 213, 344, 242, 197, 0, 187, 206, 264, 341, 59, 0, 205, 102, 328, 213, 97, 0, 30, 11, 233, 22, 0, 24, 89, 61, 27, 0, 298, 158, 235, 339, 234, 0, 72, 17, 383, 312, 0, 71, 81, 76, 136, 0, 194, 194, 101, 0, 222, 19, 244, 274, 0, 252, 5, 147, 78, 0, 159, 229, 260, 90, 0, 100, 215, 258, 256, 0, 102, 201, 175, 287, 0, 323, 8, 361, 105, 0, 230, 148, 202, 312, 0, 320, 335, 2, 266, 0, 210, 313, 297, 21, 0, 269, 82, 115, 0, 185, 177, 289, 214, 0, 258, 93, 346, 297, 0, 175, 37, 312, 0, 52, 314, 139, 288, 0, 113, 14, 218, 0, 113, 132, 114, 168, 0, 80, 78, 163, 274, 0, 135, 149, 15, 0

BG #1; Vector for Set 3

247, 198, 124, 265, 245, 5, 266, 57, 319, 30, 130, 76, 312, 257, 213, 234, 156, 1, 0, 97, 156, 89, 173, 236, 184, 261, 55, 298, 311, 170, 219, 30, 52, 49, 253, 0, 0, 0, 121, 62, 121, 216, 106, 238, 213, 108, 242, 82, 90, 124, 285, 147, 179, 141, 40, 0, 0, 74, 153, 109, 215, 136, 99, 213, 111, 176, 179, 213, 143, 119, 88, 43, 56, 86, 1, 0, 261, 247, 0, 32, 285, 3, 256, 73, 45, 268, 0, 310, 232, 149, 98, 151, 17, 83, 255, 0, 69, 303, 214, 308, 160,143, 0, 36, 105, 140, 38, 144, 38, 45, 237, 293, 0, 162, 318, 53, 265, 252, 143, 111, 263, 0, 248, 299, 214, 227, 298, 159, 0, 98, 101, 27, 88, 162, 56, 293, 0, 57, 31, 106, 81, 20, 305, 0, 7, 2, 16, 244, 284, 222, 0, 316, 57, 217, 55, 186, 92, 0, 255, 170, 81, 302, 48, 140, 0, 222, 211, 288, 143, 24, 0, 24, 296, 20, 102, 212, 0, 189, 13, 164, 315, 83, 0, 207, 214, 15, 195, 301, 0, 290, 64, 126, 79, 7, 0, 104, 182, 139, 70, 127, 0, 221, 60, 126, 74, 0, 210, 284, 122, 290, 300, 140, 128, 191, 28, 0, 287, 193, 297, 248, 0, 72, 305, 3, 46, 0, 15, 99, 30, 0, 139, 309, 304, 9, 0, 231, 49, 162, 128, 0, 84, 278, 163, 194, 0, 33, 96, 132, 58, 0, 210, 175, 146, 181, 0, 90, 252, 227, 307, 0, 28, 3, 98, 6, 0, 98, 79, 274, 227, 0, 189, 184, 129, 252, 0, 225, 271, 184, 0, 210, 28, 311, 68, 0, 201, 223, 313, 272, 0, 48, 56, 233, 0, 280, 74, 221, 319, 0, 141, 235, 126, 0, 303, 242, 52, 91, 0, 302, 265, 181, 150, 0, 237, 307, 40, 0

BG #1: Vector for Set 4

126, 197, 52, 193, 176, 190, 51, 129, 47, 21, 187, 2, 86, 170, 196, 46, 53, 1, 0, 44, 87, 21, 163, 117, 17, 107, 127, 148, 114, 20, 8, 40, 23, 69, 71, 0, 0, 0, 216, 104, 134, 19, 12, 17, 143, 68, 145, 160, 65, 98, 178, 91, 210, 173, 75, 0, 0, 37, 158, 111, 134, 117, 138, 139, 59, 146, 149, 197, 117, 48, 28, 127, 71, 177, 1, 0, 88, 99, 0, 14, 179, 106, 132, 129, 149, 60, 0, 145, 92, 127, 172, 62, 79, 59, 58, 0, 207, 32, 216, 209, 118, 69, 0, 169, 209, 123, 223, 189, 214, 47, 85, 111, 0, 32, 77, 81, 17, 18, 169, 157, 6, 0, 201, 87, 166, 83, 34, 52, 0, 204, 196, 45, 44, 196, 91, 124, 0, 119, 129, 43, 28, 16, 206, 0, 35, 131, 153, 218, 195, 0, 62, 86, 28, 91, 7, 4, 0, 31, 1, 63, 167, 152, 216, 0, 132, 105, 108, 156, 110, 0, 44, 78, 155, 218, 173, 0, 172, 211, 12, 199, 219, 0, 105, 135, 56, 74, 103, 0, 208, 159, 190, 182, 199, 0, 125, 209, 202, 131, 0, 0, 108, 28, 118, 20, 0, 31, 203, 179, 96, 0, 217, 183, 68, 84, 35, 0, 174, 42, 38, 121, 0, 125, 25, 109, 92, 0, 108, 61, 188, 0, 174, 70, 49, 142, 0, 180, 17, 104, 156, 0, 71, 52, 27, 42, 0, 130, 89, 138, 216, 0, 207, 54, 220, 50, 0, 28, 148, 165, 78, 0, 206, 32, 156, 50, 0, 2, 132, 119, 213, 0, 64, 193, 99, 23, 0, 216, 124, 150, 0, 164, 41, 123, 23, 0, 29, 29, 43, 111, 0, 85, 28, 223, 0, 57, 211, 115, 62, 0, 184, 111, 30, 0, 47, 0, 126, 189, 26, 0, 20, 187, 38, 137, 0, 41, 186, 135, 0

BG #1: Vector for Set 5

2, 233, 219, 231, 113, 201, 126, 58, 228, 225, 181, 28, 71, 255, 174, 13, 63, 1, 0, 141, 144, 144, 149, 82, 125, 247, 211, 16, 276, 183, 215, 115, 111, 208, 101, 0, 0, 0, 234, 143, 6, 157, 37, 13, 107, 186, 11, 6, 218, 257, 225, 100, 133, 150, 58, 0, 0, 276, 148, 142, 278, 88, 16, 2, 217, 150, 227, 11, 133, 12, 72, 127, 145, 41, 1, 0, 214, 147, 0, 11, 184, 238, 169, 30, 33, 63, 0, 158, 116, 78, 152, 46, 186, 130, 155, 0, 279, 70, 15, 176, 228, 144, 0, 187, 279, 181, 265, 10, 49, 45, 146, 128, 0, 67, 230, 107, 63, 36, 64, 154, 162, 0, 244, 274, 178, 0, 40, 77, 0, 38, 181, 49, 109, 109, 199, 167, 0, 131, 34, 212, 242, 142, 11, 0, 118, 213, 130, 147, 279, 0, 123, 30, 275, 95, 184, 219, 0, 89, 77, 287, 114, 134, 262, 0, 161, 72, 157, 271, 65, 0, 7, 241, 201, 214, 280, 0, 180, 133, 99, 225, 208, 0, 176, 5, 278, 99, 95, 0, 52, 145, 28, 280, 241, 0, 240, 61, 82, 183, 251, 0, 82, 64, 218, 118, 0, 280, 64, 209, 66, 0, 90, 54, 15, 241, 253, 0, 130, 149, 62, 250, 0, 236, 225, 132, 133, 0, 113, 278, 116, 0, 135, 100, 67, 283, 0, 60, 240, 115, 67, 0, 197, 171, 54, 184, 0, 144, 64, 61, 105, 0, 102, 27, 33, 129, 0, 243, 163, 138, 138, 0,116, 37, 189, 169, 0, 2, 107, 197, 46, 0, 133, 270, 144, 183, 0, 13, 99, 239, 0, 122, 10, 79, 134, 0, 59, 40, 43, 133, 0, 172, 34, 83, 0, 1, 188, 19, 78, 0, 5, 40, 147, 0, 187, 155, 176, 180, 0, 272, 198, 183, 237, 0, 270, 29, 100, 0

BG #1: Vector for Set 6

74, 41, 309, 17, 133, 68, 327, 282, 181, 153, 85, 343, 153, 4, 253, 113, 44, 1, 0, 18, 260, 68, 321, 188, 127, 131, 345, 197, 44, 302, 191, 191, 161, 3, 239, 0, 0, 0, 135, 123, 338, 313, 65, 256, 160, 179, 56, 264, 47, 158, 100, 148, 146, 75, 250, 0, 0, 129, 279, 294, 214, 207, 297, 266, 70, 39, 149, 307, 229, 0, 97, 45, 324, 338, 1, 0, 158, 116, 0, 292, 37, 269, 87, 21, 233, 75, 0, 135, 332, 328, 31, 321, 348, 213, 170, 0, 177, 155, 53, 284, 205, 207, 0, 83, 234, 125, 106, 71, 256, 324, 15, 195, 0, 291, 110, 22, 6, 53, 316, 345, 175, 0, 285, 302, 25, 286, 252, 332, 0, 107, 67, 139, 158, 32, 232, 307, 0, 285, 160, 249, 154, 5, 49, 0, 195, 99, 331, 276, 41, 0, 125, 191, 238, 339, 171, 244, 0, 349, 211, 0, 275, 350, 110, 0, 11, 15, 308, 246, 293, 0, 279, 284, 284, 2, 166, 0, 253, 122, 310, 43, 127, 0, 69, 21, 340, 155, 146, 0, 297, 6, 141, 25, 304, 0, 216, 203, 116, 119, 220, 0, 256, 154, 338, 207, 0, 168, 309, 195, 143, 0, 67, 255, 179, 316, 116, 0, 349, 166, 283, 277, 0, 119, 338, 19, 111, 0, 195, 252, 108, 0, 21, 128, 231, 346, 0, 207, 222, 234, 286, 0, 151, 100, 174, 143, 0, 326, 296, 153, 200, 0, 157, 244, 131, 196, 0, 312, 110, 146, 60, 0, 266, 268, 306, 95, 0, 129, 300, 274, 165, 0, 235, 188, 230, 279, 0, 11, 117, 68, 0, 160, 124, 340, 173, 0, 104, 302, 110, 248, 0, 9, 250, 63, 0, 24, 327, 48, 185, 0, 345, 348, 250, 0, 155, 71, 99, 233, 0, 203, 194, 185, 245, 0, 280, 218, 171, 0

BG #1: Vector for Set 7

18, 42, 124, 101, 177, 196, 133, 181, 205, 201, 168, 86, 95, 86, 201, 193, 172, 1, 0, 117, 55, 192, 46, 167, 97, 110, 167, 129, 198, 75, 49, 200, 200, 178, 168, 0, 0, 0, 121, 30, 63, 84, 83, 96, 121, 31, 94, 141, 163, 20, 56, 85, 19, 90, 12, 0, 0, 162, 1, 14, 119, 125, 21, 154, 83, 73, 53, 121, 63, 111, 187, 174, 98, 35, 1, 0, 80, 21, 0, 158, 94, 134, 189, 203, 54, 24, 0, 8, 183, 32, 189, 124, 75, 105, 94, 0, 102, 61, 69, 142, 44, 121, 0, 203, 171, 155, 105, 11, 3, 40, 22, 139, 0, 83, 73, 39, 23, 148, 95, 58, 148, 0, 160, 21, 173, 91, 46, 2, 0, 64, 126, 133, 74, 32, 83, 184, 0, 65, 174, 82, 52, 49, 18, 0, 70, 66, 130, 41, 122, 0, 3, 92, 155, 110, 0, 99, 0, 122, 36, 75, 148, 76, 59, 0, 117, 71, 193, 65, 129, 0, 115, 189, 41, 180, 27, 0, 7, 121, 47, 75, 194, 0, 4, 164, 72, 45, 84, 0, 178, 49, 141, 107, 66, 0, 70, 81, 83, 196, 53, 0, 75, 193, 109, 89, 0, 10, 11, 105, 168, 0, 26, 89, 206, 66, 32, 0, 16, 151, 141, 73, 0, 114, 119, 15, 19, 0, 95, 125, 97, 0, 112, 19, 118, 38, 0, 97, 19, 31, 11, 0, 47, 8, 139, 46, 0, 152, 151, 136, 28, 0, 101, 187, 29, 156, 0, 50, 126, 121, 133, 0, 189, 174, 177, 171, 0, 39, 110, 200, 32, 0, 14, 205, 29, 131, 0, 62, 196, 177, 0, 51, 129, 155, 162, 0, 199, 196, 109, 19, 0, 122, 82, 170, 0, 168, 98, 66, 47, 0, 128, 202, 192, 0, 145, 56, 101, 201, 0, 177, 189, 108, 64, 0, 141, 154, 90, 0

BG #1: Vector for Set 8

76, 22, 133, 38, 162, 197, 52, 166, 214, 199, 144, 93, 139, 192, 134, 1, 124, 1, 0, 1, 48, 67, 90, 54, 215, 220, 66, 222, 225, 83, 220, 226, 215, 140, 167, 59, 0, 0, 0, 154, 57, 212, 232, 44, 27, 213, 191, 203, 54, 123, 164, 0, 217, 79, 230, 90, 0, 0, 150, 123, 133, 196, 125, 58, 18, 206, 131, 42, 105, 0, 223, 131, 69, 149, 173, 1, 0, 118, 63, 0, 153, 195, 59, 200, 202, 19, 146, 0, 150, 115, 12, 52, 175, 180, 111, 95, 0, 135, 195, 125, 25, 163, 88, 0, 149, 69, 7, 43, 63, 82, 50, 26, 124, 0, 37, 191, 72, 3, 178, 13, 169, 209, 0, 187, 198, 24, 20, 189, 217, 0, 192, 179, 10, 73, 36, 139, 235, 0, 68, 238, 194, 57, 175, 44, 0, 158, 169, 5, 56, 227, 0, 42, 201, 94, 108, 73, 154, 0, 25, 186, 79, 194, 99, 182, 0, 71, 14, 114, 16, 96, 0, 160, 61, 215, 47, 36, 0, 15, 18, 91, 154, 71, 0, 196, 124, 122, 128, 189, 0, 3, 53, 42, 101, 103, 0, 94, 119, 174, 212, 199, 0, 107, 37, 7, 206, 0, 207, 93, 143, 39, 0, 171, 36, 124, 41, 124, 0, 138, 61, 14, 203, 0, 43, 108, 47, 176, 0, 167, 166, 144, 0, 114, 71, 182, 181, 0, 99, 73, 26, 81, 0, 152, 45, 71, 70, 0, 140, 190, 85, 123, 0, 74, 213, 52, 43, 0, 61, 206, 42, 45, 0, 135, 231, 140, 95, 0, 218, 211, 44, 181, 0, 147, 223, 21, 154, 0, 231, 82, 161, 0, 174, 224, 52, 111, 0, 63, 226, 187, 143, 0, 74, 227, 179, 0, 151, 189, 127, 179, 0, 199, 115, 188, 0, 51, 149, 42, 38, 0, 3, 215, 216, 72, 0, 37, 132, 212, 0

BG #2: Vector for Set 1

251, 21, 141, 195, 196, 158, 1, 0, 113, 36, 178, 173, 114, 104, 160, 81, 0, 0, 168, 237, 214, 109, 163, 0, 0, 0, 153, 55, 167, 51, 96, 109, 112, 101, 1, 0, 129, 153, 147, 0, 39, 215, 128, 109, 31, 0, 177, 22, 133, 164, 72, 0, 180, 178, 186, 64, 209, 0, 114, 246, 38, 0, 147, 180, 77, 24, 0, 193, 215, 100, 222, 0, 243, 92, 170, 183, 0, 223, 119, 229, 0, 204, 184, 13, 49, 0, 198, 199, 138, 209, 0, 87, 40, 98, 0, 24, 103, 23, 78, 0, 71, 249, 149, 40, 0, 123, 99, 45, 0, 13, 222, 140, 0, 117, 224, 108, 0, 28, 168, 213, 0, 149, 62, 0, 181, 217, 156, 0, 114, 196, 228, 0, 104, 0, 0, 204, 114, 187, 51, 0, 113, 233, 0, 114, 213, 194, 0, 233, 191, 0, 167, 94, 67, 9, 0, 216, 217, 0, 93, 209, 218, 0, 216, 96, 171, 0, 142, 125, 164, 0, 68, 0, 243, 0, 99, 246, 20, 0, 205, 36, 0, 241, 146, 27, 0, 138, 228, 53, 0, 85, 14, 254, 0, 78, 205, 70, 0

BG #2: Vector for Set 2

86, 338, 258, 27, 328, 265, 1, 0, 183, 11, 213, 329, 272, 155, 89, 214, 0, 0, 382, 288, 4, 377, 72, 0, 0, 0, 318, 13, 91, 80, 173, 116, 305, 9, 1, 0, 281, 189, 23, 0, 94, 256, 328, 100, 105, 0, 356, 333, 372, 109, 215, 0, 294, 63, 362, 30, 188, 0, 206, 39, 330, 0, 29, 77, 284, 241, 0, 135, 60, 12, 14, 0, 111, 259, 328, 196, 0, 256, 218, 319, 0, 369, 302, 238, 288, 0, 275, 357, 336, 115, 0, 186, 100, 215, 0, 289, 300, 9, 365, 0, 12, 284, 112, 248, 0, 69, 368, 331, 0, 333, 324, 314, 0, 322, 121, 188, 0, 321, 75, 5, 0, 47, 37, 0, 278, 381, 240, 0, 256, 201, 311, 0, 78, 191, 0, 52, 179, 92, 213, 0, 298, 81, 0, 45, 36, 189, 0, 120, 56, 0, 311, 214, 332, 155, 0, 48, 15, 0, 185, 89, 216, 0, 13, 48, 364, 0, 194, 116, 52, 0, 16, 56, 283, 0, 102, 307, 321, 0, 356, 246, 0, 363, 334, 259, 0, 291, 164, 334, 0, 82, 225, 104, 0, 363, 131, 294, 0

BG #2: Vector for Set 3

104, 183, 45, 64, 143, 245, 1, 0, 295, 49, 30, 209, 24, 209, 7, 51, 0, 0, 220, 14, 158, 297, 308, 0, 0, 0, 12, 253, 82, 185, 43, 267, 193, 95, 1, 0, 17, 80, 219, 0, 141, 237, 276, 91, 275, 0, 8, 74, 247, 288, 247, 0, 231, 95, 73, 235, 102, 0, 7, 258, 80, 0, 85, 58, 319, 55, 0, 229, 194, 139, 78, 0, 189, 0, 29, 176, 0, 245, 64, 91, 0, 297, 104, 298, 139, 0, 191, 114, 232, 94, 0, 116, 255, 176, 0, 43, 39, 72, 257, 0, 109, 137, 103, 306, 0, 156, 204, 93, 0, 213, 137, 207, 0, 37, 272, 65, 0, 61, 71, 287, 0, 305, 228, 0, 136, 142, 178, 0, 291, 89, 21, 0, 284, 254, 0, 0, 202, 190, 249, 0, 159, 138, 0, 217, 116, 236, 0, 160, 97, 0, 37, 155, 219, 74, 0, 237, 222, 0, 95, 0, 299, 0, 62, 199, 235, 0, 112, 17, 276, 0, 61, 4, 103, 0, 183, 112, 171, 0, 207, 138, 0, 20, 201, 6, 0, 173, 289, 133, 0, 308, 7, 218, 0, 4, 294, 97, 0

BG #2: Vector for Set 4

72, 110, 23, 181, 95, 8, 1, 0, 53, 136, 115, 156, 115, 200, 29, 31, 0, 0, 152, 131, 46, 191, 91, 0, 0, 0, 185, 6, 36, 124, 124, 110, 156, 133, 1, 0, 200, 16, 101, 0, 185, 138, 170, 219, 193, 0, 123, 55, 31, 222, 209, 0, 103, 13, 105, 150, 181, 0, 147, 43, 152, 0, 2, 30, 184, 83, 0, 174, 150, 8, 56, 0, 99, 138, 110, 99, 0, 46, 217, 109, 0, 37, 113, 143, 140, 0, 36, 95, 40, 116, 0, 116, 200, 110, 0, 75, 158, 134, 97, 0, 48, 132, 206, 2, 0, 68, 16, 156, 0, 35, 138, 86, 0, 6, 20, 141, 0, 80, 43, 81, 0, 49, 1, 0, 156, 54, 134, 0, 153, 88, 63, 0, 211, 94, 0, 90, 6, 221, 6, 0, 27, 118, 0, 216, 212, 193, 0, 108, 61, 0, 106, 44, 185, 176, 0, 147, 182, 0, 108, 21, 110, 0, 71, 12, 109, 0, 29, 201, 69, 0, 91, 165, 55, 0, 1, 175, 83, 0, 40, 12, 0, 37, 97, 46, 0, 106, 181, 134, 0, 98, 35, 36, 0, 120, 101, 81, 0

BG #2: Vector for Set 5

275, 93, 240, 20, 275, 53, 1, 0, 158, 123, 216, 68, 260, 238, 247, 164, 0, 0, 124, 243, 183, 31, 116, 0, 0, 0, 15, 268, 237, 210, 170, 64, 180, 217, 1, 0, 276, 119, 153, 0, 193, 50, 270, 5, 111, 0, 226, 78, 73, 170, 224, 0, 272, 68, 161, 122, 197, 0, 162, 92, 127, 0, 108, 17, 175, 82, 0, 29, 1, 118, 269, 0, 96, 23, 83, 161, 0, 18, 98, 19, 0, 50, 46, 277, 66, 0, 19, 158, 87, 84, 0, 207, 40, 225, 0, 15, 117, 201, 218, 0, 116, 237, 283, 216, 0, 283, 82, 61, 0, 238, 142, 19, 0, 13, 189, 75, 0, 41, 81, 229, 0, 23, 175, 0, 207, 285, 61, 0, 227, 26, 128, 0, 183, 212, 0, 131, 222, 17, 190, 0, 64, 257, 0, 139, 117, 153, 0, 69, 62, 0, 131, 81, 160, 238, 0, 53, 236, 0, 85, 269, 37, 0, 94, 225, 192, 0, 213, 16, 246, 0, 50, 213, 175, 0, 40, 70, 142, 0, 184, 43, 0, 225, 112, 9, 0, 246, 181, 204, 0, 115, 105, 245, 0, 267, 222, 162, 0

BG #2: Vector for Set 6

49, 301, 326, 81, 216, 202, 1, 0, 303, 167, 145, 45, 69, 117, 139, 129, 0, 0, 139, 172, 19, 309, 270, 0, 0, 0, 310, 156, 148, 153, 118, 222, 2, 5, 1, 0, 203, 299, 343, 0, 35, 53, 304, 325, 36, 0, 153, 68, 27, 232, 76, 0, 107, 136, 265, 205, 124, 0, 202, 269, 122, 0, 127, 103, 290, 23, 0, 104, 64, 319, 215, 0, 49, 156, 71, 224, 0, 203, 81, 137, 0, 193, 221, 74, 92, 0, 327, 146, 252, 217, 0, 199, 20, 319, 0, 18, 12, 230, 125, 0, 285, 91, 245, 317, 0, 253, 50, 105, 0, 269, 107, 121, 0, 279, 252, 67, 0, 109, 19, 225, 0, 117, 236, 0, 256, 100, 267, 0, 114, 162, 127, 0, 213, 277, 0, 210, 208, 308, 106, 0, 130, 30, 0, 332, 92, 52, 0, 9, 217, 0, 129, 206, 208, 218, 0, 98, 135, 0, 186, 178, 136, 0, 286, 84, 160, 0, 265, 46, 78, 0, 162, 35, 281, 0, 278, 52, 203, 0, 196, 332, 0, 5, 211, 1, 0, 314, 300, 194, 0, 321, 203, 271, 0, 82, 70, 229, 0

BG #2: Vector for Set 7

84, 189, 77, 26, 112, 156, 1, 0, 170, 27, 124, 115, 141, 131, 91, 174, 0, 0, 95, 131, 118, 133, 114, 0, 0, 0, 26, 31, 89, 85, 39, 62, 190, 14, 1, 0, 103, 54, 29, 0, 28, 82, 90, 51, 200, 0, 166, 48, 146, 138, 109, 0, 8, 86, 137, 103, 30, 0, 84, 195, 26, 0, 112, 6, 37, 106, 0, 102, 147, 9, 171, 0, 58, 9, 64, 192, 0, 7, 84, 168, 0, 114, 76, 182, 85, 0, 181, 114, 7, 15, 0, 166, 114, 148, 0, 188, 85, 171, 20, 0, 109, 76, 167, 9, 0, 171, 37, 50, 0, 97, 140, 194, 0, 24, 154, 158, 0, 22, 17, 137, 0, 101, 98, 0, 132, 90, 62, 0, 77, 44, 91, 0, 47, 120, 0, 81, 71, 49, 159, 0, 150, 87, 0, 18, 94, 61, 0, 197, 192, 0, 37, 79, 106, 125, 0, 168, 40, 0, 35, 81, 0, 0, 69, 17, 83, 0, 94, 160, 40, 0, 129, 5, 135, 0, 75, 86, 164, 0, 110, 139, 0, 70, 203, 139, 0, 23, 199, 94, 0, 189, 139, 207, 0, 135, 118, 155, 0

BG #2: Vector for Set 8

116, 157, 79, 101, 237, 13, 1, 0, 80, 89, 38, 24, 10, 156, 226, 99, 0, 0, 83, 84, 139, 155, 158, 0, 0, 0, 72, 220, 151, 176, 154, 161, 147, 66, 1, 0, 154, 224, 214, 0, 64, 27, 108, 85, 130, 0, 87, 107, 107, 19, 65, 0, 137, 35, 237, 124, 30, 0, 20, 10, 65, 0, 231, 224, 179, 108, 0, 24, 38, 236, 174, 0, 33, 207, 105, 33, 0, 10, 30, 200, 0, 210, 30, 41, 207, 0, 65, 105, 231, 154, 0, 76, 169, 210, 0, 203, 62, 26, 95, 0, 169, 27, 94, 67, 0, 101, 213, 201, 0, 120, 29, 188, 0, 233, 123, 68, 0, 178, 200, 13, 0, 160, 230, 0, 172, 142, 126, 0, 198, 95, 216, 0, 64, 197, 0, 227, 116, 95, 61, 0, 55, 113, 0, 62, 163, 113, 0, 110, 132, 0, 65, 192, 5, 844, 0, 0, 197, 0, 227, 131, 61, 0, 24, 80, 30, 0, 158, 29, 127, 0, 132, 76, 92, 0, 70, 224, 206, 0, 22, 199, 0, 52, 95, 239, 0, 101, 206, 226, 0, 122, 102, 72, 0, 80, 63, 122, 0

An example matrix representation of $V_{i,j}$ for base graph #1 for Set 2 is given below. Entries in the same row are separated by a comma and rows are separated by a semicolon.

[307, 19, 50, 369, −1, 181, 216, −1, −1, 317, 288, 109, 17, 357, −1, 215, 106, −1, 242, 180, 330, 346, 1, 0, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1; 76, −1, 76, 73, 288, 144, −1, 331, 331, 178, −1, 295, 342, −1, 217, 99, 354, 114, −1, 331, −1, 112, 0, 0, 0, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1; 205, 2, 320, −1, 332, 256, 161, 267, 160, 63, 129, −1, −1, 200, 88, 53, −1, 131, 240, 205, 13, −1, −1, −1, 0, 0, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1; −1, 276, 87, −1, 0, 275, −1, 199, 153, 56, −1, 132, 305, 231, 341, 212, −1, 304, 300, 271, −1, 39, 357, 1, −1, −1, 0, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1; 332, 181, −1, −1, −1, 4, −1, −1, −1, −1, −1, −1, −1, −1, −1, −1, −1, −1, −1, −1, −1, −1, −1, −1, −1, −1, −1, −1, −1, −1, −1, −1, −1, −1, −1, 0, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1; 195, 14, −1, 115, −1, −1, −1, −1, −1, −1, −1, 166, −1, −1, −1, 241, −1, −1, −1, −1, 51, 157, −1, −1, −1, −1, 0, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1; 278, −1, −1, −1, −1, −1, 257, −1, −1, −1, 1, 351, −1, 92, −1, −1, −1, 253, 18, −1, 225, −1, −1, −1, −1, −1, −1, −1, 0, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1; 9, 62, −1, −1, 316, −1, −1, −1, 333, 290, −1, −1, −1, −1, −1, 114, −1, −1, −1, −1, −1, −1, −1, −1, −1, −1, −1, −1, −1, 0, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1; 307, 179, −1, 165, −1, −1, −1, −1, −1, −1, −1, −1, 18, −1, −1, −1, 39, −1, −1, 224, −1, 368, 67, −1, 170, −1, −1, −1, −1, −1, 0, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1; 366, 232, −1, −1, −1, −1, −1, −1, −1, −1, 321, 133, −1, 57, −1, −1, −1, 303, 63, −1, 82, −1, −1, −1, −1, −1, −1, −1, −1, −1, −1, 0, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1; −1, 101, 339, −1, 274, −1, −1, 111, 383, −1, −1, −1, −1, −1, 354, −1, −1, −1, −1, −1, −1, −1, −1, −1, −1, −1, −1, −1, −1, −1, −1, −1, 0, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1; −1, 48, 102, −1, −1, −1, −1, −1, −1, −1, −1, −1, 8, −1, −1, −1, 47, −1, −1, −1, −1, 188, 314, 115, −1, −1, −1, −1, −1,

−1, −1, −1, −1, 0, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1; 77, 186, −1, −1, −1, −1, −1, −1, −1, 174, 232, −1, 50, −1, −1, −1, −1, 74, −1, −1, −1, −1, −1, −1, −1, −1, −1, −1, −1, −1, −1, −1, −1, −1, 0, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1; 313, −1, −1, 177, −1, −1, −1, 266, −1, −1, −1, −1, −1, −1, −1, −1, −1, −1, −1, 115, −1, −1, 370, −1, −1, −1, −1, −1, −1, −1, −1, −1, −1, −1, 0, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1; 142, −1, −1, −1, −1, −1, −1, −1, −1, −1, −1, 248, −1, −1, 137, 89, 347, −1, −1, −1, 12, −1, −1, −1, −1, −1, −1, −1, −1, −1, −1, −1, 0, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1; 241, 2, −1, −1, −1, −1, −1, −1, −1, 210, −1, −1, 318, −1, −1, −1, −1, 55, −1, −1, −1, −1, −1, 269, −1, −1, −1, −1, −1, −1, −1, −1, −1, −1, −1, 0, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1; −1, 13, −1, 338, −1, −1, −1, −1, −1, −1, 57, −1, −1, −1, −1, −1, −1, −1, −1, 289, −1, 57, −1, −1, −1, −1, −1, −1, −1, −1, −1, −1, −1, −1, −1, −1, 0, −1, −1, −1, −1, −1, −1, −1, −1, −1, −1, −1, −1, −1, −1, −1, −1, −1, −1, −1, −1, −1, −1, −1, −1, −1, −1, −1, −1, −1; 260, −1, −1, −1, −1, −1, −1, −1, −1, −1, −1, −1, −1, 303, −1, 81, 358, −1, −1, −1, 375, −1, −1, −1, −1, −1, −1, −1, −1, −1, −1, −1, −1, −1, −1, −1, −1, 0, −1, −1, −1, −1, −1, −1, −1, −1, −1, −1, −1, −1, −1, −1, −1, −1, −1, −1, −1, −1, −1, −1, −1, −1, −1, −1, −1, −1; −1, 130, −1, −1, −1, −1, −1, −1, −1, −1, 163, 280, −1, −1, −1, 132, 4, −1, −1, −1, −1, −1, −1, −1, −1, −1, −1, −1, −1, −1, −1, −1, −1, −1, −1, −1, −1, −1, 0, −1, −1, −1, −1, −1, −1, −1, −1, −1, −1, −1, −1, −1, 145, 213, −1, −1, −1, −1, −1, 344, 242, −1, 197, −1, −1, −1, −1, −1, −1, −1, −1, −1, −1, −1, −1, −1, −1, −1, −1, −1, −1, −1, −1, −1, −1, −1, −1, −1, −1, 0, −1, −1, −1, −1, −1, −1, −1, −1, −1, −1, −1, −1, −1, −1, −1, −1, −1, −1; 187, −1, −1, 206, −1, −1, −1, −1, 264, −1, −1, −1, −1, −1, −1, −1, −1, −1, −1, −1, 341, 59, −1, −1, −1, −1, −1, −1, −1, −1, −1, −1, −1, −1, −1, −1, −1, −1, −1, 0, −1, −1, −1, −1, −1, −1, −1, −1, −1, −1, −1, −1, −1, −1, −1, −1, −1, −1, −1, −1, −1, −1, −1; −1, 205, −1, −1, −1, 102, −1, −1, −1, −1, −1, −1, −1, −1, −1, 328, −1, −1, −1, 213, 97, −1, −1, −1, −1, −1, −1, −1, −1, −1, −1, −1, −1, −1, −1, −1, −1, −1, −1, −1, 0, −1, −1, −1, −1, −1, −1, −1, −1, −1, −1, −1, −1, −1, −1, −1, −1, −1, −1, −1, −1, −1, −1; 30, −1, −1, −1, −1, −1, −1, −1, −1, −1, −1, 11, 233, −1, −1, −1, 22, −1, −1, −1, −1, −1, −1, −1, −1, −1, −1, −1, −1, −1, −1, −1, −1, −1, −1, −1, −1, −1, −1, −1, −1, 0, −1, −1, −1, −1, −1, −1, −1, −1, −1, −1, −1, −1, −1, −1, −1, −1, −1, −1, −1; −1, 24, 89, −1, −1, −1, −1, −1, −1, 61, −1, −1, −1, −1, −1, −1, −1, 27, −1, −1, −1, −1, −1, −1, −1, −1, −1, −1, −1, −1, −1, −1, −1, −1, −1, −1, −1, −1, −1, −1, −1, −1, 0, −1, −1, −1, −1, −1, −1, −1, −1, −1, −1, −1, −1, −1, −1, −1; 298, −1, −1, 158, 235, −1, −1, −1, −1, −1, 339, −1, −1, −1, −1, −1, −1, −1, −1, −1, 234, −1, −1, −1, −1, −1, −1, −1, −1, −1, −1, −1, −1, −1, −1, −1, −1, −1, −1, −1, −1, −1, −1, 0, −1, −1, −1, −1, −1, −1, −1, −1, −1, −1, −1, −1, −1, −1, −1, −1, −1, −1, −1, −1, −1, −1; −1, 72, −1, −1, −1, −1, 17, 383, −1, −1, −1, −1, −1, −1, 312, −1, −1, −1, −1, −1, −1, −1, −1, −1, −1, −1, −1, −1, −1, −1, −1, −1, −1, −1, −1, −1, −1, −1, −1, −1, −1, −1, −1, −1, 0, −1, −1, −1, −1, −1, −1, −1, −1, −1, −1, −1, −1, −1; 71, −1, 81, −1, 76, −1, −1, −1, −1, −1, −1, −1, −1, −1, 136, −1, −1, −1, −1, −1, −1, −1, −1, −1, −1, −1, −1,

−1, −1, −1, −1, −1, −1, −1, −1, −1, −1, −1, −1, −1, −1, −1, −1, −1, −1, −1, −1, 0, −1, −1, −1, −1, −1, −1, −1, −1, −1, −1, −1, −1, −1, −1, −1, −1, −1, −1; −1, 194, −1, −1, −1, −1, 194, −1, 101, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, 0, −1, −1, −1, −1, −1, −1, −1, −1, −1, −1, −1, −1, −1, −1, −1, −1, −1, −1, −1, −1, −1; 222, −1, −1, −1, 19, −1, −1, −1, −1, −1, −1, −1, −1, −1, −1, −1, −1, −1, 244, −1, 274, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, 0, −1, −1, −1, −1, −1, −1, −1, −1, −1, −1, −1, −1, −1, −1, −1, −1, −1; −1, 252, −1, −1, −1, −1, −1, −1, −1, −1, −1, −1, 5, −1, −1, −1, 147, −1, −1, −1, −1, −1, −1, 78, −1, −1, −1, −1, 1, −1, −1, −1, −1, −1, −1, −1, −1, −1; 159, −1, −1, −1, −1, −1, −1, −1, −1, −1, 229, −1, −1, 260, −1, −1, −1, −1, −1, −1, −1, −1, −1, −1, 90, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, 0, −1, −1, −1, −1, −1, −1, −1, −1, −1, −1, −1, −1, −1, −1, −1, −1, −1, 100, −1, −1, −1, −1, 215, −1, −1, −1, −1, −1, −1, −1, −1, −1, −1, −1, −1, −1, 258, −1, −1, 256, −1, −1, −1, −1, −1, −1, −1, −1, −1, −1, −1, −1, −1, −1, −1, −1, −1, −1, −1, −1, −1, −1, 0, −1, −1, −1, −1, −1, −1, −1, −1, −1, −1, −1, −1, −1; 102, −1, −1, −1, −1, −1, −1, −1, −1, −1, −1, 201, −1, 175, −1, −1, −1, −1, −1, −1, −1, −1, −1, 287, −1, −1, −1, −1, −1, −1, −1, −1, −1, −1, −1, −1, −1, −1, −1, −1, −1, −1, −1, −1, −1, −1, −1, −1, −1, −1, −1, −1, −1, 0, −1, −1, −1, −1, −1, −1, −1, −1, −1, −1, −1, −1, −1; −1, 323, 8, −1, −1, −1, −1, −1, −1, −1, −1, 361, −1, −1, −1, −1, −1, −1, −1, −1, 105, −1, −1, −1, −1, −1, −1, −1, −1, −1, −1, −1, −1, −1, −1, −1, −1, −1, −1, −1, −1, −1, −1, −1, −1, −1, −1, 0, −1, −1, −1, −1, −1, −1, −1, −1, −1, −1, −1; 230, −1, −1, −1, −1, −1, −1, 148, −1, −1, −1, −1, −1, −1, 202, −1, 312, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, 0, −1, −1, −1, −1, −1, −1, −1, −1, −1, −1, −1, −1, −1, −1; −1, 320, −1, −1, −1, −1, 335, −1, −1, −1, −1, −1, 2, −1, −1, −1, −1, −1, −1, −1, −1, 266, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, 0, −1, −1, −1, −1, −1, −1, −1, −1, −1; 210, −1, −1, −1, −1, −1, −1, −1, −1, −1, −1, −1, 313, 297, −1, −1, 21, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, 0, −1, −1, −1, −1, −1, −1, −1, −1, −1, −1; −1, 269, −1, −1, −1, −1, −1, −1, −1, −1, −1, −1, −1, 82, −1, −1, −1, −1, −1, −1, −1, −1, 115, −1, −1, −1, −1, −1, −1, −1, −1, −1, −1, −1, −1, −1, −1, −1, −1, −1, −1, −1, −1, −1, −1, −1, −1, −1, −1, −1, 0, −1, −1, −1, −1, −1, −1, −1, −1; 185, −1, −1, −1, −1, −1, −1, −1, 177, 289, −1, 214, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, 0, −1, −1, −1, −1, −1, −1, −1; −1, 258, −1, 93, −1, −1, −1, 346, −1, −1, −1, −1, −1, −1, −1, −1, −1, −1, 297, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, 0, −1, −1, −1, −1, −1; 175, −1, −1, −1, −1, −1, −1, 37, −1, −1, −1, −1, −1, −1, −1, 312, −1, −1, −1, −1, −1, −1, −1, −1, −1, −1, −1, −1, −1, −1, −1, −1, −1, −1, −1, −1, −1, −1, −1, −1, −1, −1, −1, 0, −1, −1, −1, −1, −1; −1, 52, −1, 314, −1, −1, −1, −1, 139, −1, −1, −1, −1, −1, −1, −1, 288, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, 0, −1, −1, −1, −1; 113, −1, −1, −1, 14, −1, −1, −1, −1, −1, −1, −1, −1, −1, −1, −1, −1, −1, −1, −1, −1, −1, 218, −1, −1, −1, 1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, 0, −1, −1, −1; −1, 113, −1, −1, −1, −1, −1, −1, −1, −1, −1, −1, −1, −1, −1, −1, 132, −1, 114, −1, −1, −1, −1, −1, −1, 168, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, 0, −1, −1; 80, −1, −1, −1, −1, −1, 78, −1, 163, −1, −1, −1, −1, −1, −1, −1, −1, −1, −1, −1, −1, 274, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, 0, −1; −1, 135, −1, −1, −1, 149, −1, −1, −1, 15, −1, −, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, 1, 0]

An example matrix representation of $V_{i,j}$ for base graph #2 for Set 4 is given below. Entries in the same row are separated by a comma and rows are separated by a semicolon.

[72, 110, 23, 181, −1, −1, 95, −1, −1, 8, 1, 0, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1; 53, −1, −1, 156, 115, 156, 115, 200, 29, 31, −1, 0, 0, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1; 152, 131, −1, 46, 191, −1, −1, −1, 91, −1, 0, −1, 0, 0, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1; −1, 185, 6, −1, 36, 124, 124, 110, 156, 133, 1, −1, −1, 0, −1, −1, −1, −1, −1, −1, −1, −1, −1, −1, −1, −1, −1, −1, −1, −1, −1, −1, −1, −1, −1, −1, −1, −1, −1, −1, −1, −1, −1; 200, 16, −1, −1, −1, −1, −1, −1, 101, −1, −1, 0, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1, −1; 185, 138, −1, −1, −1, 170, −1, 219, −1, −1, −1, 193, −1, −1, −1, 0, −1, −1, −1, −1, −1, −1, −1, −1, −1, −1, −1, −1, −1, −1, −1, −1, −1, −1, −1, −1, −1, −1, −1, −1, −1, −1; 123, −1, −1, −1, 55, −1, 31, −1, 222, −1, 209, −1, −1, −1, −1, 0, −1, −1, −1, −1, −1, −1, −1, −1, −1, −1, −1, −1, −1, −1, −1, −1, −1, −1, −1, −1, −1, −1, −1, −1, −1, −1; −1, 103, −1, −1, −1, 13, −1, 105, −1, −1, −1, 150, −1, 181, −1, −1, −1, 0, −1, −1, −1, −1, −1, −1, −1, −1, −1, −1, −1, −1, −1, −1, −1, −1, −1, −1, −1, −1, −1, −1, −1, −1, −1, −1, −1, −1; 147, 43, −1, −1, −1, −1, −1, −1, −1, 152, −1, −1, −1, −1, −1, 0, −1, −1, −1, −1, −1, −1, −1, −1, −1, −1, −1, −1, −1, −1, −1, −1, −1, −1; −1; −1, 2, −1, −1, −1, −1, −1, −1, 30, −1, 184, 83, −1, −1, −1, −1, −1, −1, −1, 0, −1, −1, −1, −1, −1, −1, −1, −1, −1, −1, −1, −1, −1, −1, −1, −1, −1, −1, −1, −1, −1, −1, −1, −1, −1, −1; 174, 150, −1, −1, −1, −1, 8, 56, −1, −1, −1, −1, −1, −1, −1, −1, −1, −1, −1, −1, 0, −1, −1, −1, −1, −1, −1, −1, −1, −1, −1, −1, −1, −1, −1, −1, −1, −1, −1, −1, −1; 99, −1, −1, −1, −1, −1, 138, −1, 110, −1, −1, −1, 99, −1, −1, −1, 0, −1, −1, −1, −1, −1, −1, −1, −1, −1, −1, −1, −1, −1, −1, −1, −1, −1, −1, −1, −1, −1, −1, −1; −1, 46, −1, 217, −1, −1, −1, −1, −1, −1, 109, −1, −1, −1, −1, −1, −1, −1, −1, −1, 0, −1, −1, −1, −1, −1, −1, −1, −1, −1, −1, −1, −1, −1, −1, −1, −1,

−1, −1, −1, −1, −1, −1, −1, −1, −1, −1, −1; 37, 113, −1, −1,
−1, −1, −1, −1, 143, −1, −1, −1, −1, 140, −1, −1, −1, −1, −1,
−1, −1, −1, −1, 0, −1, −1, −1, −1, −1, −1, −1, −1, −1, −1,
−1, −1, −1, −1, −1, −1, −1, −1, −1, −1, −1, −1, −1, −1, −1,
−1, −1; −1, 36, −1, −1, −1, 95, −1, −1, −1, −1, 40, −1,
116, −1, −1, −1, −1, −1, −1, −1, −1, −1, 0, −1, −1, −1,
−1, −1, −1, −1, −1, −1, −1, −1, −1, −1, −1, −1, −1, −1, −1,
−1, −1, −1, −1, −1, −1, −1, −1, −1; 116, −1, −1, −1, −1,
−1, −1, −1, −1, 200, 110, −1, −1, −1, −1, −1, −1, −1, −1,
−1, −1, −1, −1, 0, −1, −1, −1, −1, −1, −1, −1, −1, −1, −1,
−1, −1, −1, −1, −1, −1, −1, −1, −1, −1, −1, −1, −1, −1;
−1, 75, −1, −1, −1, −1, −1, −1, −1, 158, −1, 134, 97, −1, −1,
−1, −1, −1, −1, −1, −1, −1, −1, −1, −1, 0, −1, −1, −1, −1,
−1, −1, −1, −1, −1, −1, −1, −1, −1, −1, −1, −1, −1, −1, −1,
−1, −1, −1, −1, −1, −1; 1, 48, −1, −1, −1, 132, −1, −1, −1,
−1, −1, 206, 2, −1, −1, −1, −1, −1, −1, −1, −1, −1, −1,
−1, −1, −1, 0, −1, −1, −1, −1, −1, −1, −1, −1, −1, −1, −1,
−1, −1, −1, −1, −1, −1, 1, −1, −1, −1, −1, −1; 68, −1, −1, −1,
−1, −1, 16, 156, −1, −1, −1, −1, −1, −1, −1, −1, −1, −1,
−1, −1, −1, −1, −1, −1, −1, −1, −1, 0, −1, −1, −1, −1, −1,
−1, −1, −1, −1, −1, −1, −1, −1, −1, −1, −1, −1, −1, −1, −1,
−1, −1; 35, 138, −1, −1, −1, −1, −1, −1, −1, −1, 86, −1, −1,
−1, −1, −1, −1, −1, −1, −1, −1, −1, −1, −1, −1, −1, −1, −1,
−1, 0, −1, −1, −1, −1, −1, −, −1, −1, −1, −1, −1, −1, −1,
−1, −1, −1, −1, −1, −1, −1, −1; −1, 6, −1, −1, 20, −1, −1, −1,
−1, −1, −1, 141, −1, −1, −1, −1, −1, −1, −1, −1, −1, −1,
−1, −1, −1, −1, −1, −1, −1, 0, −1, −1, −1, −1, −1, −1, −1,
−1, −1, −1, −1, −1, −1, −1, −1, −1, −1, −1, −1; 80, −1,
−1, −1, −1, −1, −1, −1, 43, −1, −1, −1, −1, 81, −1, −1, −1,
−1, −1, −1, −1, −1, −1, −1, −1, −1, −1, −1, −1, 0, −1,
−1, −1, −1, −1, −1, −1, −1, −1, −1, −1, −1, −1, −1, −1,
−1, −1, −1, −1; −1, 49, 1, −1, −1, −1, −1, −1, −1, −1, −1,
−1, −1, −1, −1, −1, −1, −1, −1, −1, −1, −1, −1, −1, −1,
−1, −1, −1, −1, −1, 0, −1, −1, −1, −1, −1, −1, −1, −1, −1,
−1, −1, −1, −1, −1, −1, −1, −1, −1; 156, −1, −1, 54, −1, 134,
−1, −1, −1, −1, −1, −1, −1, −1, −1, −1, −1, −1, −1, −1,
−1, −1, −1, −1, −1, −1, −1, −1, −1, −1, −1, 0, −1, −1, −1,
−1, −1, −1, −1, −1, −1, −1, −1, −1, −1, −1, −1, −1, −1;
−1, 153, 88, −1, −1, −1, −1, −1, −1, 63, −1, −1, −1, −1, −1,
−1, −1, −1, −1, −1, −1, −1, −1, −1, −1, −1, −1, −1, −1, −1,
−1, −1, −1, −1, 0, −1, −1, −1, −1, −1, −1, −1, −1, −1, −1,
−1, −1, −1, −1, −1, −1; 211, −1, −1, −1, −1, 94, −1, −1, −1,
−1, −1, −1, −1, −1, −1, −1, −1, −1, −1, −1, −1, −1, −1, −1,
−1, −1, −1, −1, −1, −1, −1, −1, −1, −1, −1, 0, −1, −1, −1,
−1, −1, −1, −1, −1, −1, −1, −1, −1, −1, −1; −1, −1, 90,
−1, −1, −1, −1, 6, −1, −1, −1, −1, 221, 6, −1, −1, −1, −1, −1,
−1, −1, −1, −1, −1, −1, −1, −1, −1, −1, −1, −1, −1, −1, −1,
−1, −1, 0, −1, −1, −1, −1, −1, −1, −1, −1, −1, −1, −1, −1,
−1, −1; 27, −1, −1, −1, −1, 118, −1, −1, −1, −1, −1, −1, −1,
−1, −1, −1, −1, −1, −1, −1, −1, −1, −1, −1, −1, −1, −1, −1,
−1, −1, −1, −1, −1, −1, −1, −1, −1, 0, −1, −1, −1, −1, −1, −1,
−1, −1, −1, −1, −1, −1, −1, −1; −1, 216, 212, −1, −1, 193, −1,
−1, −1, −1, −1, −1, −1, −1, −1, −1, −1, −1, −1, −1, −1, −1,
−1, −1, −1, −1, −1, −1, −1, −1, −1, −1, −1, −1, −1, −1, −1,
−1, 0, −1, −1, −1, −1, −1, −1, −1, −1, −1, −1, −1, −1; 108,
−1, −1, −1, 61, −1, −1, −1, −1, −1, −1, −1, −1, −1, −1,
−1, −1, −1, −1, −1, −1, −1, −1, −1, −1, −1, −1, −1, −1, −1,
−1, −1, −1, −1, −1, −1, −1, −1, 0, −1, −1, −1, −1, −1, −1,
−1, −1, −1, −1, −1; −1, −1, 106, −1, −1, 44, −1, 185, −1, 176,
−1, −1, −1, −1, −1, −1, −1, −1, −1, −1, −1, −1, −1, −1, −1,
−1, −1, −1, −1, −1, −1, −1, −1, −1, −1, −1, −1, −1, −1, −1,
0, −1, −1, −1, −1, −1, −1, −1, −1, −1, −1; −1, 147, −1,
−1, −1, −1, −1, −1, −1, −1, −1, −1, 182, −1, −1, −1, −1,
−1, −1, −1, −1, −1, −1, −1, −1, −1, −1, −1, −1, −1, −1,
−1, −1, −1, −1, −1, −1, −1, −1, 0, −1, −1, −1, −1, −1, −1,
−1, −1, −1; 108, −1, −1, −1, −1, 21, −1, −1, −1, −1, −1,
110, −1, −1, −1, −1, −1, −1, −1, −1, −1, −1, −1, −1, −1,

−1, −1, −1, −1, −1, −1, −1, −1, −1, −1, −1, −1, −1, −1,
−0, −1, −1, −1, −1, −1, −1, −1, −1, −1; −1, −1, 71, −1, −1,
−1, −1, 12, −1, −1, 109, −1, −1, −1, −1, −1, −1, −1, −1, −1,
−1, −1, −1, −1, −1, −1, −1, −1, −1, −1, −1, −1, −1, −1, −1,
−1, −1, −1, −1, −1, −1, −1, −1, 0, −1, −1, −1, −1, −1, −1,
−1; 29, −1, −1, −1, −1, −1, −1, −1, −1, −1, −1, 201, 69,
−1, −1, −1, −1, −1, −1, −1, −1, −1, −1, −1, −1, −1, −1, −1,
−1, −1, −1, −1, −1, −1, −1, −1, −1, −1, −1, −1, −1, −1, −1,
0, −1, −1, −1, −1, −1, −1, −1; −1, 91, −1, −1, −1, 165, −1,
−1, −1, −1, −1, 55, −1, −1, −1, −1, −1, −1, −1, −1, −1, −1,
−1, −1, −1, −1, −1, −1, −1, −1, −1, −1, −1, −1, −1, −1, −1,
−1, −1, −1, −1, −1, −1, −1, 0, −1, −1, −1, −1, −1, −1; 1,
−1, 175, −1, −1, −1, −1, 83, −1, −1, −1, −1, −1, −1, −1, −1,
−1, −1, −1, −1, −1, −1, −1, −1, −1, −1, −1, −1, −1, −1, −1,
−1, −1, −1, −1, −1, −1, −1, −1, −1, −1, −1, −1, −1, −1, −1,
0, −1, −1, −1, −1, −1; −1, −1, −1, −1, −1, −1, −1, −1, −1,
40, −1, −1, 12, −1, −1, −1, −1, −1, −1, −1, −1, −1, −1, −1,
−1, −1, −1, −1, −1, −1, −1, −1, −1, −1, −1, −1, −1, −1, −1,
−1, −1, −1, −1, −1, −1, −1, 0, −1, −1, −1, −1; −1, 37, −1, −1,
−1, 97, −1, −1, −1, −1, −1, 46, −1, −1, −1, −1, −1, −1, −1,
−1, −1, −1, −1, −1, −1, −1, −1, −1, −1, −1, −1, −1, −1, −1,
−1, −1, −1, −1, −1, −1, −1, −1, −1, −1, −1, −1, −1, 0, −1,
−1, −1; 106, −1, −1, −1, −1, −1, −1, 181, −1, −1, −1, −1, 154,
−1, −1, −1, −1, −1, −1, −1, −1, −1, −1, −1, −1, −1, −1, −1,
−1, −1, −1, −1, −1, −1, −1, −1, −1, −1, −1, −1, −1, −1, −1,
−1, −1, −1, −1, −1, −1, 0, −1, −1; −1, −1, 98, −1, −1, −1,
−1, −1, −1, 35, −1, −1, 36, −1, −1, −1, −1, −1, −1, −1, −1,
−1, −1, −1, −1, −1, −1, −1, −1, −1, −1, −1, −1, −1, −1, −1,
−1, −1, −1, −1, −1, −1, −1, −1, −1, −1, −1, −1, 0, −1; −1,
120, −1, −1, −1, 101, −1, −1, −1, −1, −1, 81, −1, −1, −1, −1,
−1, −1, −1, −1, −1, −1, −1, −1, −1, −1, −1, −1, −1, −1, −1,
−1, −1, −1, −1, −1, −1, −1, −1, −1, −1, −1, −1, −1, −1, −1,
−1, −1, −1, −1, −1, 0]

Not only ACE-values are important, but the number of cycles satisfying the worst-case ACE. Reduce this number by trying to add edges satisfying more difficult constraints and temporarily lowering these constraints if not successful. Further optimization of the code includes starting from the specified constraints but adding 1 to each etaACE value. If a shift coefficient that fulfills all the constraints cannot be found, then reduce some etaACE values for that specific variable node by 1 (back to the original specified value) and try again, until a shift coefficient that fulfills the constraints is found.

Examples of particular embodiments include the following: (a) using an LDPC code that satisfies the following (dACE_sys, etaACE_sys) constraints, with the following number of systematic variable nodes satisfying the constraint exactly and not satisfying the constraint (dACE_sys, etaACE_sys+1); (b) using an LDPC code that satisfies the following (dACE_par, etaACE_par) constraints, with the following number of systematic variable nodes satisfying the constraint exactly and not satisfying the constraint (dACE_par, etaACE_par+1); (c) the previous embodiments with more than one (dACE_sys, etaACE_sys) and/or (dACE_par, etaACE_par) constraint; and (d) the previous embodiments with different (dACE_sys, etaACE_sys) and/or (dACE_par, etaACE_par) constraints for different sub-matrices of the PCM (corresponding to different rates and/or different number of shortened columns).

Figure 2:
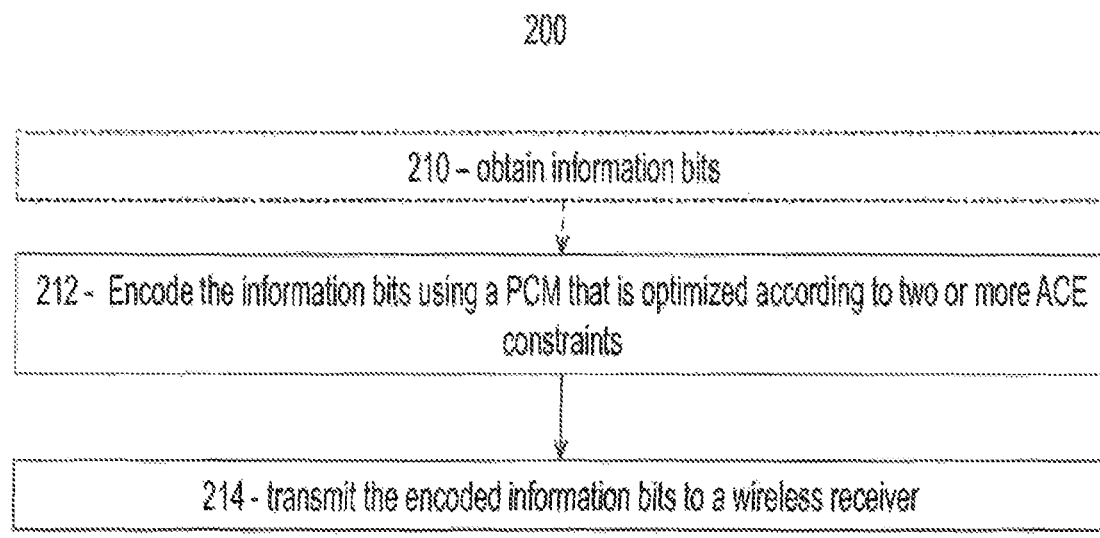
FIG. 2 is flow diagram illustrating an example method in a wireless transmitter, according to particular embodiments.
Figure 3:
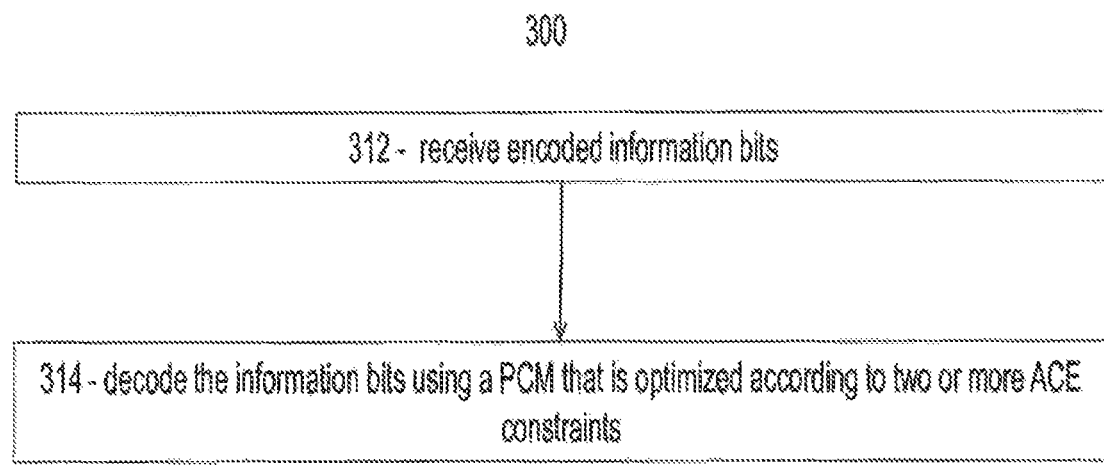
FIG. 3 is flow diagram illustrating an example method in a wireless receiver, according to particular embodiments.

The examples end embodiments described above may be generalized by the flowcharts in FIGS. 2 and 3.

FIG. 2 is flow diagram illustrating an example method in a wireless transmitter, according to some embodiments. In particular embodiments, one or more steps of FIG. 2 may be performed by network elements (e.g., wireless device 110, network node 120, etc.) of network 100 described with respect to FIG. 1.

The method may begin at step 210, where the wireless transmitter obtains information bits. For example, network node 120 may obtain information bits (e.g., user data) from a higher layer for wireless transmission to wireless device 110.

At step 212, the wireless transmitter encodes information bits using a PCM. The PCM is lifted from a base matrix and the shift coefficients used for lifting were selected to satisfy particular ACE constraints that vary for different portions of the PCM, according to any of the examples or embodiments described above. For example, network node 120 may encode information bits eating a PCM specified according to a standards specification. The PCM may be described by a vector, such as vector 1 described above. The vector may have been generated by using ACE constraints that vary based on code rate, cycle length, shift size, systematic bits, or parity bits.

At step 714, the wireless transmitter transmits the encoded information bits to a wireless receiver. For example, network node 120 may transmit the encoded information bits to wireless device 110.

Modifications, additions, or omissions may be made to method 200 of FIG. 2. Additionally, one or more steps in the method of FIG. 2 may be performed in parallel or in any suitable order. The steps may be repeated over time as necessary.

FIG. 3 is flow diagram illustrating an example method in a wireless receiver, according to some embodiments. In particular embodiments, one or more steps of FIG. 3 may be performed by network elements (e.g., wireless device 110, network node 120, etc.) of network 100 described with respect to FIG. 1.

The method begins at step 312, where the wireless receiver receives information bits encoded using a PCM. For example, wireless device 110 may receive information bits from network node 120. Receiving encoded information bits may refer to receiving a wireless signal corresponding to the encoded information bits, such as the wireless signal transmitted at, for example, step 214 of FIG. 2.

At step 314, the wireless receiver decodes the information bits using the PCM. The PCM was lifted from a base matrix using shift coefficients selected to satisfy particular ACE constraints and the particular ACE constraints vary for different portions of the PCM, according to any of the examples or embodiments described above. For example, wireless device 110 may decode information bits using a PCM specified according to a standards specification. The PCM may be described by a vector, such as vector 1 described above. The vector may have been generated by using ACE constraints that vary based on code rate, cycle length, shift size, systematic bits, or parity bits. Decoding the information bits may refer to decoding the wireless signal corresponding to the encoded information bits, resulting in the original information bits encoded, for example, at step 212 of FIG. 2.

Modifications, additions, or omissions may be made to method 300 of FIG. 3. Additionally, one or more steps in the method of FIG. 3 may be performed in parallel or in any suitable order. The steps may be repeated over time as necessary.

Figure 4A:
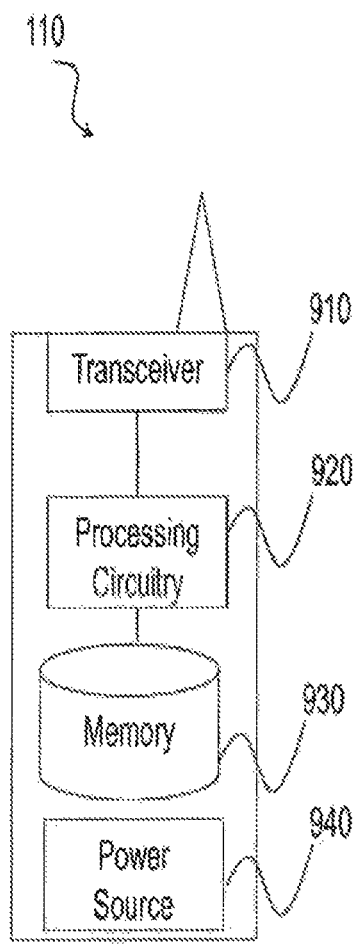
FIG. 4A is a block diagram illustrating an example embodiment of a wireless device.

FIG. 4A is a block diagram illustrating an example embodiment of a wireless device. The wireless device is an example of the wireless devices 110 illustrated in FIG. 1. In particular embodiments, the wireless device is capable of encoding and/or decoding information bits using a PCM lifted from a base matrix using shift coefficients selected to satisfy particular ACE constraints and the particular ACE constraints vary for different portions of the PCM, according to any of the examples and embodiments described above.

Particular examples of a wireless device include a mobile phone, a smart phone, a FDA (Personal Digital Assistant), a portable computer (e.g., laptop, tablet), a sensor, a modem, a machine type (MTC) device/machine to machine (M2M) device, laptop embedded equipment (LEE), laptop mounted equipment (LME), USB dongles, a device-to-device capable device, a vehicle-to-vehicle device, or any other device that can provide wireless communication. The wireless device includes transceiver 910, processing circuitry 920, memory 930, and power source 940. In some embodiments, transceiver 910 facilitates transmitting wireless signals to and receiving wireless signals from wireless network node 120 (e.g., via an antenna), processing circuitry 920 executes instructions to provide some or all of the functionality described herein as provided by the wireless device, and memory 930 stores the instructions executed by processing circuitry 920. Power source 940 supplies electrical power to one or more of the components of wireless device 110, such as transceiver 910, processing circuitry 920, and/or memory 930.

Processing circuitry 920 includes any suitable combination of hardware and software implemented in one or more integrated circuits or modules to execute instructions and manipulate data to perform some or all of the described functions of the wireless device. In some embodiments, processing circuitry 920 may include, for example, one or more computers, one more programmable logic devices, one or more central processing units (CPUs), one or more microprocessors, one or more applications, and/or other logic, and/or any suitable combination of the preceding. Processing circuitry 920 may include analog and/or digital circuitry configured to perform some or all of the described functions of wireless device 110. For example, processing circuitry 920 may include resistors, capacitors, inductors, transistors, diodes, and/or any other suitable circuit components.

Memory 930 is generally operable to store computer executable code and data. Examples of memory 930 include computer memory (e.g., Random Access Memory (RAM) or Read Only Memory (ROM)), mass storage media (e.g., a hard disk), removable storage media (e.g., a Compact Disk (CD) or a Digital Video Disk (DVD)), and/or or any other volatile or non-volatile, non-transitory computer-readable and/or computer-executable memory devices that store information.

Power source 940 in generally operable to supply electrical power to the components of wireless device 110. Power source 940 may include any suitable type of battery, such as lithium-ion, lithium-air, lithium polymer, nickel cadmium, nickel metal hydride, or any other suitable type of battery for supplying power to a wireless device.

Other embodiments of the wireless device may include additional components (beyond those shown in FIG. 4A) responsible for providing certain aspects of the wireless device's functionality, including any of the functionality described above and/or any additional functionality (including any functionality necessary to support the solution described above).

Figure 4B:
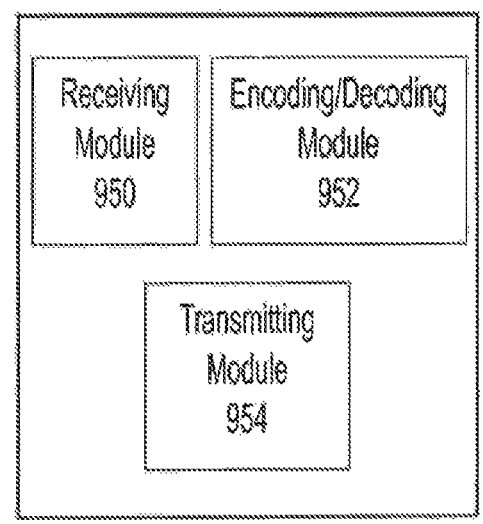
FIG. 4B is a block diagram illustrating example components of a wireless device.

FIG. 4B is a block diagram illustrating example components of a wireless device 110. The components may include receiving module 950, encoding/decoding module 952, and transmitting module 954.

Receiving module 950 may perform the receiving functions of wireless device 110. For example, receiving module 950 may receive encoded information bits. In certain embodiments, receiving module 950 may include or be included in processing circuitry 920. In particular embodiments, receiving module 950 may communicate with encoding/decoding module 952 and transmitting module 954.

Encoding/decoding module 952 may perform the encoding and decoding functions of wireless device 110. For example, encoding/decoding module 952 may encode or decode information bits using a PCM. The PCM is lifted from a base matrix and the shift coefficients used for lifting were selected to satisfy particular ACE constraints that vary for different portions of the PCM, according to any of the examples and embodiments described above. In certain embodiments, encoding/decoding module 952 may include or be included in processing circuitry 920. In particular embodiments, encoding/decoding module 952 may communicate with receiving module 950 and transmitting module 954.

Some embodiments, such as low complexity devices, may only include an encoding module or a decoding module, but not both. Although the functional modules are illustrated as a single module, the encoding circuitry comprises part of a transmitter chain and the decoding circuitry comprises part of a receiver chain.

Transmitting module 954 may perform the transmitting functions of wireless device 110. For example, transmitting module 954 may transmit encoded information bits. In certain embodiments, transmitting module 954 may include or be included in processing circuitry 920. In particular embodiments, transmitting module 954 may communicate with receiving module 950 and encoding/decoding module 952.

FIG. 3A is a block diagram illustrating an example embodiment of a network node. The network node is an example of the network node 120 illustrated in FIG. 1. In particular embodiments, the network node is capable of encoding and/or decoding information bits using a PCM lifted from a base matrix using shift coefficients selected to satisfy particular ACE constraints and the particular ACE constraints vary for different portions of the PCM, according to any of the examples and embodiments described above.

Network node 120 can be an eNodeB, a nodeB, a gNB, a base station, a wireless access point (e.g., a Wi-Fi access point), a low power node, a base transceiver station (BTS), a transmission point or node, a remote RF unit (RRU), a remote radio head (RRH), or other radio access node. The network node includes at least one transceiver 1010, at least one processing circuitry 1020, at least one memory 1030 and at least one network interface 1040. Transceiver 1010 facilitates transmitting wireless signals to and receiving wireless signals from a wireless device, such as wireless devices 110 (e.g., via an antenna); processing circuitry 1020 executes instructions to provide some or all of the functionality described above as being provided by a network node 120; memory 1030 stores the instructions executed by processing circuitry 1020; end network interface 1040 communicates signals to backend network components, such as a gateway, switch, router, Internet, Public Switched Telephone Network (PSTN), controller, and/or other network nodes 120. Processing circuitry 1020 and memory 1030 can be of the same types as described with respect to processing circuitry 920 and memory 930 of FIG. 4A above.

In some embodiments, network interface 1040 is communicatively coupled to processing circuitry 1020 and refers to any suitable device operable to receive input for network node 120, send output from network node 120, perform suitable processing of the input or output or both, communicate to other devices, or any combination of the preceding. Network interface 1040 includes appropriate hardware (e.g., port, modem, network interface card, etc.) and software, including protocol conversion and data processing capabilities, to communicate through a network.

Other embodiments of network nosh 120 include additional components (beyond those shown in FIG. 5A) responsible for providing certain aspects of the network node's functionality, including any of the functionality described above and/or any additional functionality (including any functionality necessary to support the solution described above). The various different types of network nodes may include components having the same physical hardware but configured (e.g., via programming) to support different radio access technologies, or may represent partly or entirely different physical components.

FIG. 5B is a block diagram illustrating example components of a network node 120. The components may include receiving module 1050, encoding/decoding module 1052, and transmitting module 1054.

Receiving module 1050 may perform the receiving functions of network node 120. For example, receiving module 1050 may receive encoded information bits. In certain embodiments, receiving module 1050 may include or be included in processing circuitry 1020. In particular embodiments, receiving module 1050 may communicate with encoding/decoding module 1052 and transmitting module 1054.

Encoding/decoding module 1052 may perform the encoding and decoding functions of network node 120. For example, encoding/decoding module 1052 may encode or decode information bits using a PCM. The PCM is lilted from a base matrix and the shift coefficients used for lifting were selected to satisfy particular ACE constraints that vary for different portions of the PCM, according to any of the examples and embodiments described above. In certain embodiments, encoding/decoding module 1052 may include or be included in processing circuitry 1020. In particular embodiments, encoding/decoding module 1052 may communicate with receiving module 1050 and transmitting module 1054.

Some embodiments, such as low complexity devices, may only include an encoding module or a decoding module, but not both. Although the functional modules are illustrated as a single module, the encoding circuitry comprises part of a transmitter chain and the decoding circuitry comprises part of a receiver chain.

Transmitting module 1054 may perform the transmitting functions of network node 120. For example, transmitting module 1054 may transmit encoded information bits. In certain embodiments, transmitting module 1054 may include or be included in processing circuitry 1020. In particular embodiments, transmitting module 1054 may communicate with receiving module 1050 and signal locating module 1052.

Modifications, additions, or omissions may be made to the systems and apparatuses disclosed herein without departing from the scope of the invention. The components of the systems and apparatuses may be integrated or separated. Moreover, the operations of the systems and apparatuses may be performed by more, fewer, or other components. Additionally, operations of the systems and apparatuses may be performed using any suitable logic comprising software, hardware, and/or other logic. As used in this document, "each" refers to each member of a set or each member of a subset of a set.

Modifications, additions, or omissions may be made to the methods disclosed herein without departing from the scope of the invention. The methods may include more, fewer, or other steps. Additionally, steps may be performed in any suitable order.

Although this disclosure has been described in terms of certain embodiments, alterations and permutations of the embodiments will be apparent to those skilled in the art. Accordingly, the above description of the embodiments does not constrain this disclosure. Other changes, substitutions, and alterations are possible without departing from the spirit and scope of this disclosure, as defined by the claims below.

Abbreviations used in the preceding description include:
3GPP Third Generation Partnership Project
ACE Approximate Cycle EMD
BTS Base Transceiver Station
D2D Device to Device
EMD Extrinsic Message Degree
eNB eNodeB
FDD Frequency Division Duplex
LDPC Low-Density Parity Check
LTE Long Term Evolution
MAC Medium Access Control
M2M Machine to Machine
MIMO Multi-Input Multi-Output
MTC Machine Type Communication
NR New Radio
OFDM Orthogonal Frequency Division Multiplexing
PCM Parity Check Matrix
PDSCH Physical Downlink Shared Channel
PUCCH Physical Uplink Control Channel
RAN Radio Access Network
RAT Radio Access Technology
RBS Radio Belie Station
RNC Radio Network Controller
RRC Radio Resource Control
RRH Remote Radio Head
RRU Remote Radio Unit
SINR Signal-to-Interference-plus-Noise Ratio
TDD Time Division Duplex
UE User Equipment
UL Uplink
URLLC Ultra-Reliable Low-Latency Communication
UTRAN Universal Terrestrial Radio Access Network
WAN Wireless Access Network

The invention claimed is:

1. A wireless transmitter comprising processing circuitry operable to:
encode information bits using a low-density parity check, LDPC, code and a parity check matrix, PCM, the PCM being partitioned into square sub-matrices of size $Z \times Z$ and being described by a base matrix and a shift vector, the shift vector using a shift size $Z=7*2^j$, where j is one of 0, 1, 2, 3, 4 and 5; and
transmit the encoded information bits to a wireless receiver,
wherein the base matrix has one entry for each $Z \times Z$ sub-matrix, the entry being 0 corresponding to the sub-matrix being a null matrix, and the entry being 1 corresponding to the sub-matrix being a cyclic-permutation matrix obtained from a $Z \times Z$ identity matrix by shifting columns to the right by k elements,
wherein non-zero entries in the base matrix are described by triples (e, r, c) denoting that the non-zero entry with number e is in row r and column c of the base matrix, the triples being given by:
(1, 1, 1) (2, 1, 2) (3, 1, 3) (4, 1, 4) (5, 1, 7) (6, 1, 10) (7, 1, 11) (8, 1, 12) (9, 2, 1) (10, 2, 4) (11, 2, 5) (12, 2, 6) (13, 2, 7) (14, 2, 8) (15, 2, 9) (16, 2, 10) (17, 2, 12) (18, 2, 13) (19, 3, 1) (20, 3, 2) (21, 3, 4) (22, 3, 5) (23, 3, 9) (24, 3, 11) (25, 3, 13) (26, 3, 14) (27, 4, 2) (28, 4, 3) (29, 4, 5) (30, 4, 6) (31, 4, 7) (32, 4, 8) (33, 4, 9) (34, 4, 10) (35, 4, 11) (36, 4, 14) (37, 5, 1) (38, 5, 2) (39, 5, 12) (40, 5, 15) (41, 6, 1) (42, 6, 2) (43, 6, 6) (44, 6, 8) (45, 6, 12) (46, 6, 16) (47, 7, 1) (48, 7, 6) (49, 7, 8) (50, 7, 10) (51, 7, 12) (52, 7, 17) (53, 8, 2) (54, 8, 6) (55, 8, 8) (56, 8, 12) (57, 8, 14) (58, 8, 18) (59, 9, 1) (60, 9, 2) (61, 9, 13) (62, 9, 19) (63, 10, 2) (64, 10, 9) (65, 10, 11) (66, 10, 12) (67, 10, 20) (68, 11, 1) (69, 11, 2) (70, 11, 7) (71, 11, 8) (72, 11, 21) (73, 12, 1) (74, 12, 8) (75, 12, 10) (76, 12, 14) (77, 12, 22) (78, 13, 2) (79, 13, 4) (80, 13, 12) (81, 13, 23) (82, 14, 1) (83, 14, 2) (84, 14, 9) (85, 14, 14) (86, 14, 24) (87, 15, 2) (88, 15, 7) (89, 15, 12) (90, 15, 14) (91, 15, 25) (92, 16, 1) (93, 16, 11) (94, 16, 12) (95, 16, 26) (96, 17, 2) (97, 17, 10) (98, 17, 12) (99, 17, 13) (100, 17, 27) (101, 18, 2) (102, 18, 6) (103, 18, 12) (104, 18, 13) (105, 18, 28) (106, 19, 1) (107, 19, 7) (108, 19, 8) (109, 19, 29) (110, 20, 1) (111, 20, 2) (112, 20, 11) (113, 20, 30) (114, 21, 2) (115, 21, 5) (116, 21, 12) (117, 21, 31) (118, 22, 1) (119, 22, 9) (120, 22, 14) (121, 22, 32) (122, 23, 2) (123, 23, 3) (124, 23, 33) (125, 24, 1) (126, 24, 4) (127, 24, 6) (128, 24, 34) (129, 25, 2) (130, 25, 3) (131, 25, 10) (132, 25, 35) (133, 26, 1) (134, 26, 6) (135, 26, 36) (136, 27, 3) (137, 27, 8) (138, 27, 13) (139, 27, 14) (140, 27, 37) (141, 28, 1) (142, 28, 7) (143, 28, 38) (144, 29, 2) (145, 29, 3) (146, 29, 6) (147, 29, 39) (148, 30, 1) (149, 30, 5) (150, 30, 40) (151, 31, 3) (152, 31, 6) (153, 31, 8) (154, 31, 10) (155, 31, 41) (156, 32, 2) (157, 32, 14) (158, 32, 42) (159, 33, 1) (160, 33, 6) (161, 33, 13) (162, 33, 43) (163, 34, 3) (164, 34, 8) (165, 34, 11) (166, 34, 44) (167, 35, 1) (168, 35, 13) (169, 35, 14) (170, 35, 45) (171, 36, 2) (172, 36, 6) (173, 36, 12) (174, 36, 46) (175, 37, 1) (176, 37, 3) (177, 37, 8) (178, 37, 47) (179, 38, 11) (180, 38, 14) (181, 38, 48) (182, 39, 2) (183, 39, 6) (184, 39, 12) (185, 39, 49) (186, 40, 1) (187, 40, 8) (188, 40, 13) (189, 40, 50) (190, 41, 3) (191, 41, 11) (192, 41, 14) (193, 41, 51) (194, 42, 2) (195, 42, 6) (196, 42, 12) (197, 42, 52),
wherein for the non-zero entry with number e the number k is defined by a shift coefficient given by mod(Ve, Z), with Ve denoting the e-th element of the shift vector and the shift vector is:
[251, 21, 141, 195, 196, 158, 1, 0, 113, 36, 178, 173, 114, 104, 160, 81, 0, 0, 168, 237, 214, 109, 163, 0, 0, 0, 153, 55, 167, 51, 96, 109, 112, 101, 1, 0, 129, 153, 147, 0, 39, 215, 128, 109, 31, 0, 177, 22, 133, 164, 72, 0, 180, 178, 186, 64, 209, 0, 114, 246, 38, 0, 147, 180, 77, 24, 0, 193, 215, 100, 222, 0, 243, 92, 170, 183, 0, 223, 119, 229, 0, 204, 184, 13, 49, 0, 198, 199, 138, 209, 0, 87, 40, 98, 0, 24, 103, 23, 78, 0, 71, 249, 149, 40, 0, 123, 99, 45, 0, 13, 222, 140, 0, 117, 224, 108, 0, 28, 168, 213, 0, 149, 62, 0, 181, 217, 156, 0, 114, 196, 228, 0, 104, 0, 0, 204, 114, 187, 51, 0, 113, 233, 0, 114, 213, 194, 0, 233, 191, 0, 167, 94, 67, 9, 0, 216, 217, 0, 93, 209, 218, 0, 216, 96, 171, 0, 142, 125, 164, 0, 68, 0, 243, 0, 99, 246, 20, 0, 205, 36, 0, 241, 146, 27, 0, 138, 228, 53, 0, 85, 14, 254, 0, 78, 205, 70, 0].

2. The wireless transmitter of claim 1, wherein the wireless transmitter comprises a network node.

3. The wireless transmitter of claim 1, wherein the wireless transmitter comprises a wireless device.

4. A wireless receiver comprising processing circuitry operable to:
receive encoded information bits from a wireless transmitter; and
decode the information bits using a low-density parity check, LDPC, code and a parity check matrix, PCM, the PCM being partitioned into square sub-matrices of size Z×Z and being described by a base matrix and a shift vector, the shift vector using a shift size $Z=7*2^j$, where j is one of 0, 1, 2, 3, 4 and 5,
wherein the base matrix has one entry for each Z×Z sub-matrix, the entry being 0 corresponding to the sub-matrix being a null matrix, and the entry being 1 corresponding to the sub-matrix being a cyclic-permutation matrix obtained from a Z×Z identity matrix by shifting columns to the right by k elements,
wherein non-zero entries in the base matrix are described by triples (e, r, c) denoting that the non-zero entry with number e is in row r and column c of the base matrix, the triples being given by:
(1, 1, 1) (2, 1, 2) (3, 1, 3) (4, 1, 4) (5, 1, 7) (6, 1, 10) (7, 1, 11) (8, 1, 12) (9, 2, 1) (10, 2, 4) (11, 2, 5) (12, 2, 6) (13, 2, 7) (14, 2, 8) (15, 2, 9) (16, 2, 10) (17, 2, 12) (18, 2, 13) (19, 3, 1) (20, 3, 2) (21, 3, 4) (22, 3, 5) (23, 3, 9) (24, 3, 11) (25, 3, 13) (26, 3, 14) (27, 4, 2) (28, 4, 3) (29, 4, 5) (30, 4, 6) (31, 4, 7) (32, 4, 8) (33, 4, 9) (34, 4, 10) (35, 4, 11) (36, 4, 14) (37, 5, 1) (38, 5, 2) (39, 5, 12) (40, 5, 15) (41, 6, 1) (42, 6, 2) (43, 6, 6) (44, 6, 8) (45, 6, 12) (46, 6, 16) (47, 7, 1) (48, 7, 6) (49, 7, 8) (50, 7, 10) (51, 7, 12) (52, 7, 17) (53, 8, 2) (54, 8, 6) (55, 8, 8) (56, 8, 12) (57, 8, 14) (58, 8, 18) (59, 9, 1) (60, 9, 2) (61, 9, 13) (62, 9, 19) (63, 10, 2) (64, 10, 9) (65, 10, 11) (66, 10, 12) (67, 10, 20) (68, 11, 1) (69, 11, 2) (70, 11, 7) (71, 11, 8) (72, 11, 21) (73, 12, 1) (74, 12, 8) (75, 12, 10) (76, 12, 14) (77, 12, 22) (78, 13, 2) (79, 13, 4) (80, 13, 12) (81, 13, 23) (82, 14, 1) (83, 14, 2) (84, 14, 9) (85, 14, 14) (86, 14, 24) (87, 15, 2) (88, 15, 7) (89, 15, 12) (90, 15, 14) (91, 15, 25) (92, 16, 1) (93, 16, 11) (94, 16, 12) (95, 16, 26) (96, 17, 2) (97, 17, 10) (98, 17, 12) (99, 17, 13) (100, 17, 27) (101, 18, 2) (102, 18, 6) (103, 18, 12) (104, 18, 13) (105, 18, 28) (106, 19, 1) (107, 19, 7) (108, 19, 8) (109, 19, 29) (110, 20, 1) (111, 20, 2) (112, 20, 11) (113, 20, 30) (114, 21, 2) (115, 21, 5) (116, 21, 12) (117, 21, 31) (118, 22, 1) (119, 22, 9) (120, 22, 14) (121, 22, 32) (122, 23, 2) (123, 23, 3) (124, 23, 33) (125, 24, 1) (126, 24, 4) (127, 24, 6) (128, 24, 34) (129, 25, 2) (130, 25, 3) (131, 25, 10) (132, 25, 35) (133, 26, 1) (134, 26, 6) (135, 26, 36) (136, 27, 3) (137, 27, 8) (138, 27, 13) (139, 27, 14) (140, 27, 37) (141, 28, 1) (142, 28, 7) (143, 28, 38) (144, 29, 2) (145, 29, 3) (146, 29, 6) (147, 29, 39) (148, 30, 1) (149, 30, 5) (150, 30, 40) (151, 31, 3) (152, 31, 6) (153, 31, 8) (154, 31, 10) (155, 31, 41) (156, 32, 2) (157, 32, 14) (158, 32, 42) (159, 33, 1) (160, 33, 6) (161, 33, 13) (162, 33, 43) (163, 34, 3) (164, 34, 8) (165, 34, 11) (166, 34, 44) (167, 35, 1) (168, 35, 13) (169, 35, 14) (170, 35, 45) (171, 36, 2) (172, 36, 6) (173, 36, 12) (174, 36, 46) (175, 37, 1) (176, 37, 3) (177, 37, 8) (178, 37, 47) (179, 38, 11) (180, 38, 14) (181, 38, 48) (182, 39, 2) (183, 39, 6) (184, 39, 12) (185, 39, 49) (186, 40, 1) (187, 40, 8) (188, 40, 13) (189, 40, 50) (190, 41, 3) (191, 41, 11) (192, 41, 14) (193, 41, 51) (194, 42, 2) (195, 42, 6) (196, 42, 12) (197, 42, 52),
wherein for the non-zero entry with number e the number k is defined by a shift coefficient given by mod(Ve, Z), with Ve denoting the e-th element of the shift vector and the shift vector is:
[251, 21, 141, 195, 196, 158, 1, 0, 113, 36, 178, 173, 114, 104, 160, 81, 0, 0, 168, 237, 214, 109, 163, 0, 0, 0, 153, 55, 167, 51, 96, 109, 112, 101, 1, 0, 129, 153, 147, 0, 39, 215, 128, 109, 31, 0, 177, 22, 133, 164, 72, 0, 180, 178, 186, 64, 209, 0, 114, 246, 38, 0, 147, 180, 77, 24, 0, 193, 215, 100, 222, 0, 243, 92, 170, 183, 0, 223, 119, 229, 0, 204, 184, 13, 49, 0, 198, 199, 138, 209, 0, 87, 40, 98, 0, 24, 103, 23, 78, 0, 71, 249, 149, 40, 0, 123, 99, 45, 0, 13, 222, 140, 0, 117, 224, 108, 0, 28, 168, 213, 0, 149, 62, 0, 181, 217, 156, 0, 114, 196, 228, 0, 104, 0, 0, 204, 114, 187, 51, 0, 113, 233, 0, 114, 213, 194, 0, 233, 191, 0, 167, 94, 67, 9, 0, 216, 217, 0, 93, 209, 218, 0, 216, 96, 171, 0, 142, 125, 164, 0, 68, 0, 243, 0, 99, 246, 20, 0, 205, 36, 0, 241, 146, 27, 0, 138, 228, 53, 0, 85, 14, 254, 0, 78, 205, 70, 0].

5. The wireless receiver of claim 4, wherein the wireless receiver comprises a network node.

6. The wireless receiver of claim 4, wherein the wireless receiver comprises a wireless device.

7. A method for use in a wireless transmitter of a wireless communication network, the method comprising:
encoding information bits using a low-density parity check (LDPC) code and a parity check matrix (PCM), the PCM being partitioned into square sub-matrices of size Z×Z and being described by a base matrix and a shift vector, the shift vector using a shift size $Z=7*2^j$, where j is one of 0, 1, 2, 3, 4 and 5; and
transmitting the encoded information bits to a wireless receiver,
wherein the base matrix has one entry for each Z×Z sub-matrix, the entry being 0 corresponding to the sub-matrix being a null matrix, and the entry being 1 corresponding to the sub-matrix being a cyclic-permutation matrix obtained from a Z×Z identity matrix by shifting columns to the right by k elements,
wherein non-zero entries in the base matrix are described by triples (e, r, c) denoting that the non-zero entry with number e is in row r and column c of the base matrix, the triples being given by:
(1, 1, 1) (2, 1, 2) (3, 1, 3) (4, 1, 4) (5, 1, 7) (6, 1, 10) (7, 1, 11) (8, 1, 12) (9, 2, 1) (10, 2, 4) (11, 2, 5) (12, 2, 6) (13, 2, 7) (14, 2, 8) (15, 2, 9) (16, 2, 10) (17, 2, 12) (18, 2, 13) (19, 3, 1) (20, 3, 2) (21, 3, 4) (22, 3, 5) (23, 3, 9) (24, 3, 11) (25, 3, 13) (26, 3, 14) (27, 4, 2) (28, 4, 3) (29, 4, 5) (30, 4, 6) (31, 4, 7) (32, 4, 8) (33, 4, 9) (34, 4, 10) (35, 4, 11) (36, 4, 14) (37, 5, 1) (38, 5, 2) (39, 5, 12) (40, 5, 15) (41, 6, 1) (42, 6, 2) (43, 6, 6) (44, 6, 8) (45, 6, 12) (46, 6, 16) (47, 7, 1) (48, 7, 6) (49, 7, 8) (50, 7, 10) (51, 7, 12) (52, 7, 17) (53, 8, 2) (54, 8, 6) (55, 8, 8) (56, 8, 12) (57, 8, 14) (58, 8, 18) (59, 9, 1) (60, 9, 2) (61, 9, 13) (62, 9, 19) (63, 10, 2) (64, 10, 9) (65, 10, 11) (66, 10, 12) (67, 10, 20) (68, 11, 1) (69, 11, 2) (70, 11, 7) (71, 11, 8) (72, 11, 21) (73, 12, 1) (74, 12, 8) (75, 12, 10) (76, 12, 14) (77, 12, 22) (78, 13, 2) (79, 13, 4) (80, 13, 12) (81, 13, 23) (82, 14, 1) (83, 14, 2) (84, 14, 9) (85, 14, 14) (86, 14, 24) (87, 15, 2) (88, 15, 7) (89, 15, 12) (90, 15, 14) (91, 15, 25) (92, 16, 1) (93, 16, 11) (94, 16, 12) (95, 16, 26) (96, 17, 2) (97, 17, 10) (98, 17, 12) (99, 17, 13) (100, 17, 27) (101, 18, 2) (102, 18, 6) (103, 18, 12) (104, 18, 13) (105, 18, 28) (106, 19, 1) (107, 19, 7) (108, 19, 8) (109, 19, 29) (110, 20, 1) (111, 20, 2) (112, 20, 11) (113, 20, 30) (114, 21, 2) (115, 21, 5) (116, 21, 12) (117, 21, 31) (118, 22, 1) (119, 22, 9) (120, 22, 14) (121, 22, 32) (122, 23, 2) (123, 23, 3) (124, 23, 33) (125, 24, 1) (126, 24, 4) (127, 24, 6) (128, 24, 34) (129, 25, 2) (130, 25, 3) (131, 25, 10) (132, 25, 35) (133, 26, 1) (134, 26, 6) (135, 26, 36) (136, 27, 3) (137, 27, 8) (138, 27, 13) (139, 27, 14) (140, 27, 37) (141, 28, 1) (142, 28, 7) (143, 28, 38) (144, 29, 2) (145, 29, 3) (146, 29, 6) (147, 29, 39) (148, 30, 1) (149, 30, 5) (150, 30, 40) (151, 31, 3) (152, 31, 6) (153, 31, 8) (154, 31, 10) (155, 31, 41) (156, 32, 2) (157, 32, 14) (158, 32, 42) (159, 33, 1) (160, 33, 6) (161, 33, 13) (162, 33, 43) (163, 34, 3) (164, 34, 8) (165, 34, 11) (166, 34, 44) (167, 35, 1) (168, 35, 13) (169, 35, 14) (170, 35, 45) (171, 36, 2) (172, 36, 6) (173, 36, 12) (174, 36, 46) (175, 37, 1) (176, 37, 3) (177, 37, 8) (178, 37, 47) (179, 38, 11) (180, 38, 14) (181, 38, 48) (182, 39, 2) (183, 39, 6) (184, 39, 12) (185, 39, 49) (186, 40, 1) (187, 40, 8) (188, 40, 13) (189, 40, 50) (190, 41, 3) (191, 41, 11) (192, 41, 14) (193, 41, 51) (194, 42, 2) (195, 42, 6) (196, 42, 12) (197, 42, 52), wherein for the non-zero entry with number e the number k is defined by a shift coefficient given by mod(Ve, Z), with Ve denoting the e-th element of the shift vector and the shift vector is:

[251, 21, 141, 195, 196, 158, 1, 0, 113, 36, 178, 173, 114, 104, 160, 81, 0, 0, 168, 237, 214, 109, 163, 0, 0, 0, 153, 55, 167, 51, 96, 109, 112, 101, 1, 0, 129, 153, 147, 0, 39, 215, 128, 109, 31, 0, 177, 22, 133, 164, 72, 0, 180, 178, 186, 64, 209, 0, 114, 246, 38, 0, 147, 180, 77, 24, 0, 193, 215, 100, 222, 0, 243, 92, 170, 183, 0, 223, 119, 229, 0, 204, 184, 13, 49, 0, 198, 199, 138, 209, 0, 87, 40, 98, 0, 24, 103, 23, 78, 0, 71, 249, 149, 40, 0, 123, 99, 45, 0, 13, 222, 140, 0, 117, 224, 108, 0, 28, 168, 213, 0, 149, 62, 0, 181, 217, 156, 0, 114, 196, 228, 0, 104, 0, 0, 204, 114, 187, 51, 0, 113, 233, 0, 114, 213, 194, 0, 233, 191, 0, 167, 94, 67, 9, 0, 216, 217, 0, 93, 209, 218, 0, 216, 96, 171, 0, 142, 125, 164, 0, 68, 0, 243, 0, 99, 246, 20, 0, 205, 36, 0, 241, 146, 27, 0, 138, 228, 53, 0, 85, 14, 254, 0, 78, 205, 70, 0].

8. The method of claim 7, wherein the wireless transmitter is a network node.

9. The method of claim 7, wherein the wireless transmitter is a wireless device.

10. A method for use in a wireless receiver of a wireless communication network, the method comprising:

receiving (312) encoded information bits from a wireless transmitter; and decoding (314) the information bits using a low-density parity check (LDPC) code and a parity check matrix (PCM), the PCM being partitioned into square sub-matrices of size Z×Z and being described by a base matrix and a shift vector, the shift vector using a shift size $Z=7*2^j$, where j is one of 0, 1, 2, 3, 4 and 5, wherein the base matrix has one entry for each Z×Z sub-matrix, the entry being 0 corresponding to the sub-matrix being a null matrix, and the entry being 1 corresponding to the sub-matrix being a cyclic-permutation matrix obtained from a Z×Z identity matrix by shifting columns to the right by k elements, wherein non-zero entries in the base matrix are described by triples (e, r, c) denoting that the non-zero entry with number e is in row r and column c of the base matrix, the triples being given by:

(1, 1, 1) (2, 1, 2) (3, 1, 3) (4, 1, 4) (5, 1, 7) (6, 1, 10) (7, 1, 11) (8, 1, 12) (9, 2, 1) (10, 2, 4) (11, 2, 5) (12, 2, 6) (13, 2, 7) (14, 2, 8) (15, 2, 9) (16, 2, 10) (17, 2, 12) (18, 2, 13) (19, 3, 1) (20, 3, 2) (21, 3, 4) (22, 3, 5) (23, 3, 9) (24, 3, 11) (25, 3, 13) (26, 3, 14) (27, 4, 2) (28, 4, 3) (29, 4, 5) (30, 4, 6) (31, 4, 7) (32, 4, 8) (33, 4, 9) (34, 4, 10) (35, 4, 11) (36, 4, 14) (37, 5, 1) (38, 5, 2) (39, 5, 12) (40, 5, 15) (41, 6, 1) (42, 6, 2) (43, 6, 6) (44, 6, 8) (45, 6, 12) (46, 6, 16) (47, 7, 1) (48, 7, 6) (49, 7, 8) (50, 7, 10) (51, 7, 12) (52, 7, 17) (53, 8, 2) (54, 8, 6) (55, 8, 8) (56, 8, 12) (57, 8, 14) (58, 8, 18) (59, 9, 1) (60, 9, 2) (61, 9, 13) (62, 9, 19) (63, 10, 2) (64, 10, 9) (65, 10, 11) (66, 10, 12) (67, 10, 20) (68, 11, 1) (69, 11, 2) (70, 11, 7) (71, 11, 8) (72, 11, 21) (73, 12, 1) (74, 12, 8) (75, 12, 10) (76, 12, 14) (77, 12, 22) (78, 13, 2) (79, 13, 4) (80, 13, 12) (81, 13, 23) (82, 14, 1) (83, 14, 2) (84, 14, 9) (85, 14, 14) (86, 14, 24) (87, 15, 2) (88, 15, 7) (89, 15, 12) (90, 15, 14) (91, 15, 25) (92, 16, 1) (93, 16, 11) (94, 16, 12) (95, 16, 26) (96, 17, 2) (97, 17, 10) (98, 17, 12) (99, 17, 13) (100, 17, 27) (101, 18, 2) (102, 18, 6) (103, 18, 12) (104, 18, 13) (105, 18, 28) (106, 19, 1) (107, 19, 7) (108, 19, 8) (109, 19, 29) (110, 20, 1) (111, 20, 2) (112, 20, 11) (113, 20, 30) (114, 21, 2) (115, 21, 5) (116, 21, 12) (117, 21, 31) (118, 22, 1) (119, 22, 9) (120, 22, 14) (121, 22, 32) (122, 23, 2) (123, 23, 3) (124, 23, 33) (125, 24, 1) (126, 24, 4) (127, 24, 6) (128, 24, 34) (129, 25, 2) (130, 25, 3) (131, 25, 10) (132, 25, 35) (133, 26, 1) (134, 26, 6) (135, 26, 36) (136, 27, 3) (137, 27, 8) (138, 27, 13) (139, 27, 14) (140, 27, 37) (141, 28, 1) (142, 28, 7) (143, 28, 38) (144, 29, 2) (145, 29, 3) (146, 29, 6) (147, 29, 39) (148, 30, 1) (149, 30, 5) (150, 30, 40) (151, 31, 3) (152, 31, 6) (153, 31, 8) (154, 31, 10) (155, 31, 41) (156, 32, 2) (157, 32, 14) (158, 32, 42) (159, 33, 1) (160, 33, 6) (161, 33, 13) (162, 33, 43) (163, 34, 3) (164, 34, 8) (165, 34, 11) (166, 34, 44) (167, 35, 1) (168, 35, 13) (169, 35, 14) (170, 35, 45) (171, 36, 2) (172, 36, 6) (173, 36, 12) (174, 36, 46) (175, 37, 1) (176, 37, 3) (177, 37, 8) (178, 37, 47) (179, 38, 11) (180, 38, 14) (181, 38, 48) (182, 39, 2) (183, 39, 6) (184, 39, 12) (185, 39, 49) (186, 40, 1) (187, 40, 8) (188, 40, 13) (189, 40, 50) (190, 41, 3) (191, 41, 11) (192, 41, 14) (193, 41, 51) (194, 42, 2) (195, 42, 6) (196, 42, 12) (197, 42, 52), wherein for the non-zero entry with number e the number k is defined by a shift coefficient given by mod(Ve, Z), with Ve denoting the e-th element of the shift vector and the shift vector is:

[251, 21, 141, 195, 196, 158, 1, 0, 113, 36, 178, 173, 114, 104, 160, 81, 0, 0, 168, 237, 214, 109, 163, 0, 0, 0, 153, 55, 167, 51, 96, 109, 112, 101, 1, 0, 129, 153, 147, 0, 39, 215, 128, 109, 31, 0, 177, 22, 133, 164, 72, 0, 180, 178, 186, 64, 209, 0, 114, 246, 38, 0, 147, 180, 77, 24, 0, 193, 215, 100, 222, 0, 243, 92, 170, 183, 0, 223, 119, 229, 0, 204, 184, 13, 49, 0, 198, 199, 138, 209, 0, 87, 40, 98, 0, 24, 103, 23, 78, 0, 71, 249, 149, 40, 0, 123, 99, 45, 0, 13, 222, 140, 0, 117, 224, 108, 0, 28, 168, 213, 0, 149, 62, 0, 181, 217, 156, 0, 114, 196, 228, 0, 104, 0, 0, 204, 114, 187, 51, 0, 113, 233, 0, 114, 213, 194, 0, 233, 191, 0, 167, 94, 67, 9, 0, 216, 217, 0, 93, 209, 218, 0, 216, 96, 171, 0, 142, 125, 164, 0, 68, 0, 243, 0, 99, 246, 20, 0, 205, 36, 0, 241, 146, 27, 0, 138, 228, 53, 0, 85, 14, 254, 0, 78, 205, 70, 0].

11. The method of claim 10, wherein the wireless receiver is a network node.

12. The method of claim 10, wherein the wireless receiver is a wireless device.

* * * * *

UNITED STATES PATENT AND TRADEMARK OFFICE
CERTIFICATE OF CORRECTION

PATENT NO. : 11,848,685 B2
APPLICATION NO. : 18/059202
DATED : December 19, 2023
INVENTOR(S) : Sandberg et al.

It is certified that error appears in the above-identified patent and that said Letters Patent is hereby corrected as shown below:

On the Title Page

In Item (57), under "ABSTRACT", in Column 2, Line 3, delete "purity" and insert -- parity --, therefor.

In the Specification

In Column 1, Line 8, delete "2020," and insert -- 2020, now U.S. Pat. No. 11,515,893, --, therefor.

In Column 1, Line 10, delete "2019," and insert -- 2019, now U.S. Pat. No. 10,644,724, --, therefor.

In Column 1, Line 39, delete "elect" and insert -- element --, therefor.

In Column 2, Line 14, delete "d$_l$" and insert -- d$_i$ --, therefor.

In Column 2, Line 23, delete "limes" and insert -- times --, therefor.

In Column 3, Line 11, delete "$V_{r_k,c_k}=a_{c_k}$" and insert -- $V_{r_k,c_k}=a_{e_k}$ --, therefor.

In Column 3, Line 47, delete "(128, 11, 13)" and insert -- (128, 11, 15) --, therefor.

In Column 3, Line 64, delete "(205, 23, 43)" and insert -- (205, 23, 45) --, therefor.

In Column 3, Line 65, delete "(211, 23, 1)" and insert -- (211, 25, 1) --, therefor.

In Column 4, Line 12, delete "(275, 37, 39)" and insert -- (275, 37, 59) --, therefor.

In Column 4, Line 31, delete "(39, 5, 17)" and insert -- (39, 5, 12) --, therefor.

Signed and Sealed this
Fifth Day of November, 2024

Katherine Kelly Vidal
*Director of the United States Patent and Trademark Office*

In Column 4, Lines 39-40, delete "(83, 14, 14)" and insert -- (85, 14, 14) --, therefor.

In Column 4, Line 42, delete "(99, 17, 130" and insert -- (99, 17, 13) --, therefor.

In Column 4, Line 43, delete "(104, 111, 13)" and insert -- (104, 18, 13) --, therefor.

In Column 4, Line 45, delete "(110, 20, 1)," and insert -- (110, 20, 1) --, therefor.

In Column 4, Line 47, delete "(127, 23, 2)" and insert -- (122, 23, 2) --, therefor.

In Column 4, Line 52, delete "(146, 39, 6)" and insert -- (146, 29, 6) --, therefor.

In Column 4, Lines 58-59, delete "(174, 30, 46)" and insert -- (174, 36, 46) --, therefor.

In Column 5, Line 44, delete "Tice" and insert -- The --, therefor.

In Column 6, Line 24, delete "of" and insert -- or --, therefor.

In Column 6, Line 27, delete "those" and insert -- these --, therefor.

In Column 6, Line 66, delete "etaACE). If" and insert -- etcACE) if --, therefor.

In Column 6, Line 67, delete "2-dACE" and insert -- 2·dACE --, therefor.

In Column 7, Line 7, delete "inquires" and insert -- requires --, therefor.

In Column 7, Line 21, delete "shot" and insert -- short --, therefor.

In Column 8, Line 3, delete "(each" and insert -- (such --, therefor.

In Column 8, Line 46, delete "end" and insert -- and --, therefor.

In Column 8, Line 48, delete "flames," and insert -- frames, --, therefor.

In Column 8, Line 67, delete "lung" and insert -- long --, therefor.

In Column 9, Line 55, delete "1 1 0 0 0 0 0 0 0 1 0 0 1 1 0 0 0 0 0 0 1 1 0".

In Column 10, Line 25, delete "passible" and insert -- possible --, therefor.

In Column 10, Line 57, delete "withA" and insert -- with A --, therefor.

In Column 11, Line 21, delete "β=0," and insert -- B=0, --, therefor.

In Column 11, Line 40, delete "bald." and insert -- bold. --, therefor.

CERTIFICATE OF CORRECTION (continued)
U.S. Pat. No. 11,848,685 B2

In Column 12, Line 2, delete "etaACE-Infinity" and insert -- etaACE=Infinity --, therefor.

In Column 13, Line 56, delete "act" and insert -- set --, therefor.

In Column 15, Line 4, delete "smeller" and insert -- smaller --, therefor.

In Column 15, Line 37, delete "2-160" and insert -- Z=160 --, therefor.

In Column 15, Line 67, delete "N*2" and insert -- N*Z --, therefor.

In Column 16, Line 53, delete "1," and insert -- 4, --, therefor.

In Column 16, Line 64, delete "BG #1;" and insert -- BG #1: --, therefor.

In Column 16, Line 66, delete "130," and insert -- 150, --, therefor.

In Column 17, Line 2, delete "213," and insert -- 215, --, therefor.

In Column 17, Line 9, delete "2, 16," and insert -- 216, --, therefor.

In Column 17, Line 14, delete "290," and insert -- 290, 0, --, therefor.

In Column 17, Line 21, delete "150," and insert -- 160, --, therefor.

In Column 17, Line 38, delete "131," and insert -- 18, --, therefor.

In Column 17, Line 45, delete "47, 0, 126," and insert -- 47, 126, --, therefor.

In Column 18, Line 15, delete "213," and insert -- 28, --, therefor.

In Column 18, Line 20, delete "211," and insert -- 28, --, therefor.

In Column 18, Line 61, delete "1, 48," and insert -- 148, --, therefor.

In Column 19, Line 55, delete "137," and insert -- 157, --, therefor.

In Column 19, Line 61, delete "133," and insert -- 153, --, therefor.

In Column 19, Line 66, delete "136," and insert -- 156, --, therefor.

In Column 20, Line 12, delete "134," and insert -- 154, --, therefor.

In Column 20, Line 15, delete "53," and insert -- 55, --, therefor.

In Column 20, Line 26, delete "213," and insert -- 215, --, therefor.

CERTIFICATE OF CORRECTION (continued)
U.S. Pat. No. 11,848,685 B2

In Column 20, Line 37, delete "137," and insert -- 157, --, therefor.

In Column 20, Line 50, delete "131," and insert -- 151, --, therefor.

In Column 21, Line 8, delete "844," and insert -- 84, --, therefor.

In Column 21, Line 20, delete "-1, -1;" and insert -- -1; --, therefor.

In Column 21, Line 25, delete "2, 320," and insert -- 250, 328, --, therefor.

In Column 21, Line 30, delete "-1," and insert -- -1; --, therefor.

In Column 21, Line 34, delete "-1;" and insert -- -1, -1; --, therefor.

In Column 21, Line 34, delete "-1, 4," and insert -- -1, -1, --, therefor.

In Column 21, Line 48, delete "-1, -1, 330," and insert -- -1, 330, --, therefor.

In Column 21, Line 66, delete "-1, 48," and insert -- -1; 48, --, therefor.

In Column 21, Line 67, delete "314," and insert -- 334, --, therefor.

In Column 22, Line 34, delete "-1, 145," and insert -- -1; 145, --, therefor.

In Column 22, Lines 39-40, delete "264, -1, -1," and insert -- 264, -1, 341, --, therefor.

In Column 22, Line 40, delete "341," and insert -- -1, --, therefor.

In Column 23, Line 14, delete "1" and insert -- -1 --, therefor.

In Column 23, Line 15, delete "-1, -1; 159," and insert -- -1, -1, -1, -1, -1, -1, -1, -1, -1, -1, -1, -1, -1, 0, -1, -1, -1, -1, -1, -1, -1, -1, -1, -1, -1, -1, -1, -1, -1, -1; 159 --, therefor.

In Column 23, Line 19, delete "-1, -1, 100," and insert -- -1; -1, 100, --, therefor.

In Column 24, Line 10, delete "-1, -1, 0," and insert -- -1, 0, --, therefor.

In Column 25, Line 24, delete "-, -1," and insert -- -1, -1, --, therefor.

In Column 26, Line 63, delete "end" and insert -- and --, therefor.

In Column 27, Line 15, delete "eating" and insert -- using --, therefor.

In Column 28, Line 7, delete "FDA" and insert -- PDA --, therefor.

CERTIFICATE OF CORRECTION (continued)
U.S. Pat. No. 11,848,685 B2

In Column 28, Line 51, delete "in" and insert -- is --, therefor.

In Column 29, Line 11, delete "lilted" and insert -- lifted --, therefor.

In Column 29, Line 35, delete "FIG. 3A" and insert -- FIG. 5A --, therefor.

In Column 29, Line 47, delete "RF" and insert -- radio --, therefor.

In Column 29, Line 50, delete "1030" and insert -- 1030, --, therefor.

In Column 29, Line 58, delete "end" and insert -- and --, therefor.

In Column 30, Line 8, delete "nosh" and insert -- node --, therefor.

In Column 30, Line 36, delete "lilted" and insert -- lifted --, therefor.

In Column 31, Line 38, delete "Belie" and insert -- Base --, therefor.